United States Patent [19]

Mine et al.

[11] Patent Number: 5,804,631

[45] Date of Patent: Sep. 8, 1998

[54] CURABLE ORGANOSILOXANE COMPOSITIONS AND SEMICONDUCTOR DEVICES

[75] Inventors: Katsutoshi Mine; Osamu Mitani; Kazumi Nakayoshi; Rikako Tazawa, all of Chiba Prefecture, Japan

[73] Assignee: Dow Corning Toray Silicone Co., Ltd., Tokyo, Japan

[21] Appl. No.: 688,456

[22] Filed: Jul. 30, 1996

[30] Foreign Application Priority Data

Aug. 4, 1995 [JP] Japan .................................. 7-219859
Aug. 4, 1995 [JP] Japan .................................. 7-219860

[51] Int. Cl.⁶ .................................................. C08K 3/08
[52] U.S. Cl. ........................... 524/440; 257/783; 528/15; 528/16; 528/17; 524/780; 524/785; 427/387
[58] Field of Search ............................. 257/783; 528/15, 528/16, 17; 524/780, 785, 440; 427/387

[56] References Cited

U.S. PATENT DOCUMENTS

| | | |
|---|---|---|
| 4,477,641 | 10/1984 | Matsumoto . |
| 4,754,013 | 6/1988 | Antonen . |
| 5,145,931 | 9/1992 | Nakayoshi et al. ........................ 528/15 |
| 5,173,765 | 12/1992 | Nakayoshi et al. ...................... 257/783 |
| 5,254,656 | 10/1993 | Bilgrien et al. ............................ 528/15 |
| 5,360,858 | 11/1994 | Fujiki et al. .............................. 524/434 |
| 5,384,075 | 1/1995 | Okami ........................................ 528/15 |
| 5,449,734 | 9/1995 | Kotani et al. .............................. 528/12 |
| 5,504,174 | 4/1996 | Onishi ....................................... 525/478 |

*Primary Examiner*—Melvyn I. Marquis
*Attorney, Agent, or Firm*—Paula J. Lagattuta; Larry A. Milco

[57] ABSTRACT

A curable organosiloxane composition useable as a silicone die attach adhesive, an electrically conductive silicone rubber composition each comprising a composition that cures through both addition and condensation reactions, that will not impair wire bondability to a semiconductor chip or lead frame after the semiconductor chip has been bonded to a substrate or package; and semiconductor devices in which the semiconductor chip is bonded to its substrate or package using the curable organosiloxane composition and in which the semiconductor device that evidences high reliability by virtue of the use of the curable organosiloxane composition.

35 Claims, 2 Drawing Sheets

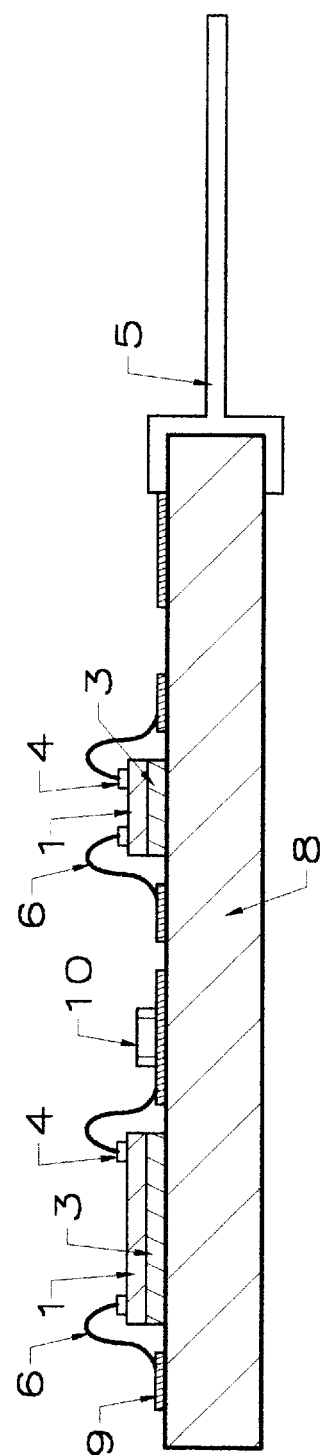

CURABLE ORGANOSILOXANE COMPOSITIONS AND SEMICONDUCTOR DEVICES

BACKGROUND OF THE INVENTION

1. Field of the Invention

This invention relates to curable organosiloxane compositions and semiconductor devices. More particularly, the present invention relates to curable organosiloxane compositions that are usable as silicone die attach adhesives that can be used to adhere a semiconductor device to a substrate and that will not impair the bondability of a wire to a semiconductor chip or to a lead frame. The invention also relates to electrically conductive silicone rubber compositions whose cure yields a highly electrically conductive silicone rubber and is not accompanied by contamination of the area around the composition with low-molecular-weight silicone oil. The invention also relates to semiconductor devices that evidence a high reliability by virtue of the use of the silicone die attach adhesive or the electrically conductive silicone rubber composition.

2. Description of the Related Art

Semiconductor devices are fabricated by first bonding the semiconductor chip to a substrate using a solder such as the Au/Si eutectic, or using an epoxy, polyimide, or silicone die attach adhesive. The substrate is often referred to a package or a semiconductor package. The semiconductor chip and lead frame are then electrically connected in a wire bonding operation using, for example, gold or aluminum wire. The semiconductor chip is thereafter resin-sealed using an epoxy resin or a polyphenylene sulfide resin. Silicone die attach adhesives are used because they are able to relax the stresses induced in the semiconductor chip. However, the heretofore known silicone die attach adhesives are associated with such problems as an impairment in the wire bondability (wire joinability) of the semiconductor chip to the lead frame; defective adherence between the sealing resin and semiconductor chip, substrate and lead frame; and an impaired moisture resistance by the semiconductor device. In order to solve these problems, Japanese Patent Application Laid Open (Kokai or Unexamined) Number Hei 3-157474 (157,474/1991) has proposed a silicone die attach adhesive comprising an addition-curing organopolysiloxane composition with a reduced content of volatile low-molecular-weight siloxane.

However, even the silicone die attach adhesive disclosed by Japanese Patent Application Laid Open (Kokai or Unexamined) Number Hei 3-157474 cannot totally overcome the problem of the impairment of the wire bondability of the semiconductor chip and lead frame, nor the problem of the degeneration in moisture resistance by the semiconductor device.

As a result of various investigations, it has been confirmed that during attachment of the semiconductor chip to a substrate using the heretofore known silicone die attach adhesives the surface of the semiconductor chip, substrate, lead frame, etc., becomes contaminated by low-molecular-weight silicone oil bleeding out from silicone die attach adhesive that prior to its thermosetting has been squeezed out around the edges of the semiconductor chip. It was also confirmed that this contamination resulted in the impairment of wire bondability to these surfaces, defective bonding with the sealant resin, and impaired moisture resistance of the semiconductor device.

The inventors attempted the use of an addition-curing silicone die attach adhesive that cured immediately at room temperature in order to inhibit this silicone oil bleed from silicone die attach adhesive squeezed out along the edges of the semiconductor chip. However, the handling properties of this silicone die attach adhesive were so severely compromised that the die bonding operation could not be carried out.

As a result of extensive investigations directed to solving the problems described above, the inventors discovered that these problems could be solved by attaching the semiconductor chip to its substrate with a curable organopolysiloxane composition that cures by both addition and condensation reactions. With the use of such a composition, a cured film is immediately formed—through the action of atmospheric moisture—on the surface of the silicone die attach adhesive that prior to its thermosetting has been squeezed out along the edges of the semiconductor chip. The present invention is based on this discovery.

Conductive silicone rubber compositions cure to give silicone rubbers that evidence an excellent conductivity. These compositions are used, for example, as adhesives to fix quartz plates, e.g., quartz filters or the quartz resonators mounted in quartz oscillators, on a substrate, as adhesives for fixing piezoelectric substrates in packages, as materials for shielding from electromagnetic radiation, and as die attach adhesives for bonding the semiconductor chips of semiconductor elements on a substrate or package. However, the use of the heretofore known conductive silicone rubber compositions to attach a semiconductor chip to a substrate or package is associated with such problems as an impairment in the wire bondability (wire joinability) to the semiconductor chip and lead frame; defective adherence between the sealing resin and semiconductor chip, substrate or package, and lead frame; and an impaired moisture resistance by the semiconductor device. In order to solve these problems, Japanese Patent Application Laid Open (Kokai or Unexamined) Number Hei 3-170581 (170,581/1991) has proposed an addition-curing conductive silicone rubber composition with a reduced content of volatile low-molecular-weight siloxane.

However, even the conductive silicone rubber composition disclosed by Japanese Patent Application Laid Open (Kokai or Unexamined) Number Hei 3-170581 cannot provide an acceptable inhibition of the impairment in wire bondability to the semiconductor chip and lead frame and the degeneration in moisture resistance by the semiconductor device.

As a result of various investigations, it has been confirmed that during attachment of the semiconductor chip to a substrate or package using the heretofore known conductive silicone rubber compositions the surface of the semiconductor chip, substrate, package, lead frame, etc., becomes contaminated by low-molecular-weight silicone oil that has bled out from the composition that prior to its thermosetting has been squeezed out around the edges of the semiconductor chip. It was also confirmed that this contamination resulted in the impairment of wire bondability to these surfaces, defective bonding with the sealant resin, and impaired moisture resistance by the semiconductor device.

The inventors attempted the use of an addition-curing conductive silicone rubber composition that cured immediately at room temperature in order to inhibit this bleed of low-molecular-weight silicone oil from the composition squeezed out along the edges of the semiconductor chip. However, this composition had severely impaired handling properties.

As a result of extensive investigations directed to solving the problems described above, the inventors discovered that these problems could be solved by attaching the semiconductor chip to its substrate or package with a conductive silicone rubber composition that cures by both addition and condensation reactions. With the use of such a composition, a cured film is immediately formed—through the action of atmospheric moisture—on the surface of the composition, which thereby prevents contamination of the area around the composition by low-molecular-weight silicone oil. The present invention is based on this discovery.

In specific terms the objects of the present invention are to provide a silicone die attach adhesive that will not impair wire bondability to the semiconductor chip or lead frame after the semiconductor chip has been bonded to its substrate. An additional objective is to provide a conductive silicone rubber composition whose cure yields a highly conductive silicone rubber and is not accompanied by contamination of the area around the composition with low-molecular-weight silicone oil. An additional object of the present invention is to provide a semiconductor device that evidences a high reliability because the semiconductor chip contained therein is bonded to its substrate or package by the use of the silicone die attach adhesive or electrically conductive silicone rubber composition.

SUMMARY OF THE INVENTION

The present invention relates to a silicone die attach adhesive comprising a curable organopolysiloxane composition that cures through both addition and condensation reactions and to a semiconductor device in which the semiconductor chip is bonded to its substrate using the silicone die attach adhesive. The present invention also relates to an electrically conductive silicone composition and to a semiconductor device in which the semiconductor is bonded to its substrate using the electrically conductive silicone rubber composition of the present invention.

BRIEF DESCRIPTION OF THE DRAWINGS

FIG. 2 is a cross-sectional drawing of a semiconductor device within the scope of the present invention.

Figure 1:
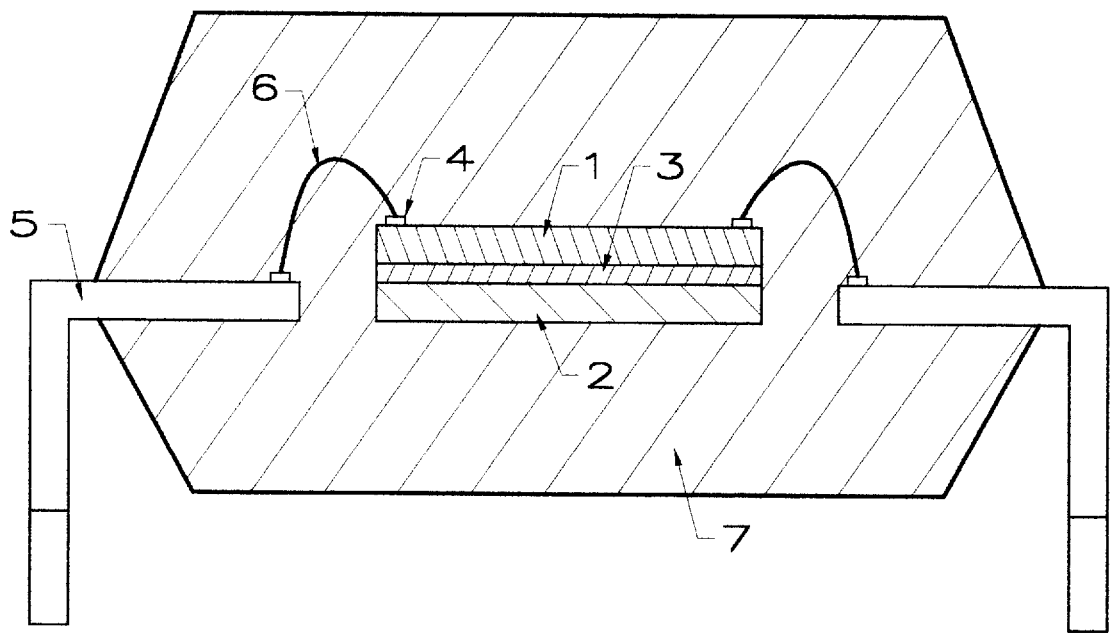
FIG. 1 is a cross-sectional drawing of the semiconductor device used in the examples.

REFERENCE NUMBERS 1 semiconductor chip
2 tab
3 cured silicone die attach adhesive
4 aluminum bonding pad
5 copper lead frame
6 gold bonding wire
7 epoxy resin sealant
8 ceramic circuit substrate
9 copper circuit interconnect
10 electrical elements such as capacitors, resistors, etc.

DETAILED DESCRIPTION OF THE INVENTION

The silicone die attach adhesive according to the present invention characteristically comprises a curable organopolysiloxane composition that cures by both addition and condensation reactions. An example of such a curable organopolysiloxane composition is the curable organopolysiloxane composition comprising (A) 100 parts by weight of a mixture of
  (a) 5 to 95 weight % of an alkoxy-substituted organopolysiloxane that has a viscosity at 25° C. of 20 to 200,000 mPa.s, that contains an average of at least two silicon-bonded alkoxy groups per molecule, and that does not contain any silicon-bonded alkenyl groups; and
  (b) 95 to 5 weight % of an alkenyl-substituted organopolysiloxane that has a viscosity at 25° C. of 20 to 200,000 mPa.s, that contains an average of at least two silicon-bonded alkenyl groups per molecule, and that does not contain any silicon-bonded alkoxy groups;,
(B) an organopolysiloxane that has a viscosity at 25° C. of 20 to 20,000 mPa.s and that contains an average of at least two silicon-bonded hydrogen atoms per molecule, in a quantity that affords a value from 0.3 to 20 for the molar ratio of silicon-bonded hydrogen atoms in component (B) to silicon-bonded alkenyl groups in component (b);
(C) 0.01 to 10 parts by weight of a condensation reaction catalyst; and
(D) platinum catalyst in a catalytic quantity.

Another example of such a composition is the curable organopolysiloxane composition comprising (A') 100 parts by weight of an alkenyl-substituted organopolysiloxane that has a viscosity at 25° C. of 20 to 200,000 mPa.s, that contains an average of at least two silicon-bonded alkenyl groups per molecule, and that optionally contains an average of at least one silicon-bonded alkoxy group per molecule;

(B') an organopolysiloxane that has a viscosity at 25° C. of 2 to 20,000 mPa.s, that contains an average of at least 2 silicon-bonded hydrogen atoms per molecule, and that optionally contains an average of at least one silicon-bonded alkoxy group per molecule, in a quantity that affords a value from 0.3 to 20 for the molar ratio of silicon-bonded hydrogen atoms in component (B') to silicon-bonded alkenyl groups in component (A');

(C) 0.01 to 10 parts by weight of a condensation reaction catalyst; and (D) platinum catalyst in a catalytic quantity; with the proviso that at least one of components (A') and (B') contains an average of at least two silicon-bonded alkoxy groups per molecule.

The first-named curable organopolysiloxane composition will be considered in detail first.

Component (A), which is the base or main ingredient of this composition, is a mixture of (a) an alkoxy-substituted organopolysiloxane that has a viscosity at 25° C. of 20 to 200,000 mPa.s, that contains an average of at least two silicon-bonded alkoxy groups per molecule, and that does not contain any silicon-bonded alkenyl groups and (b) an alkenyl-substituted organopolysiloxane that has a viscosity at 25° C. of 20 to 200,000 mPa.s, that contains an average of at least two silicon-bonded alkenyl groups per molecule, and that does not contain any silicon-bonded alkoxy groups. Component (a) should contain an average of at least two silicon-bonded alkoxy groups per molecule. Impaired wire bondability to the semiconductor chip and lead frame and impaired moisture resistance by the semiconductor device will occur when this component contains an average of less than two silicon-bonded alkoxy groups per molecule. The molecular structure of component (a) is exemplified by straight chain, partially branched straight chain, and branched chain, wherein straight chain is preferred. The silicon-bonded alkoxy in component (a) is exemplified by methoxy, ethoxy, propoxy, butoxy, methoxymethoxy, and methoxyethoxy, with methoxy being preferred. The alkoxy group may be bonded in terminal or nonterminal position on the molecular chain, but bonding at the molecular chain terminals is preferred for the corresponding good reactivity. The alkoxy may be directly bonded to main-chain silicon, or it may be bonded to a silicon atom that in turn is bonded to main-chain silicon across an alkylene group. The non-alkoxy silicon-bonded groups in component (a) are exemplified by alkyl groups such as methyl, ethyl, propyl, butyl, pentyl, hexyl, heptyl, octyl, nonyl, decyl, octadecyl, and so forth; cycloalkyl groups such as cyclopentyl, cyclohexyl, and so forth; aryl groups such as phenyl, tolyl, xylyl, naphthyl, and so forth; aralkyl groups such as benzyl, phenethyl, phenylpropyl, and so forth; and haloalkyl groups such as 3-chloropropyl, 3,3,3-trifluoropropyl, and so forth. The preferred non-alkoxy silicon-bonded groups are methyl and phenyl. The viscosity of component (a) at 25° C. should be from 20 to 200,000 mPa.s and is preferably from 100 to 100,000 mPa.s. A viscosity at 25° C. below 20 mPa.s leads to a decline in the physical properties of the ultimately obtained cured product, for example, in the flexibility and elongation. Viscosities in excess of 200,000 mPa.s lead to a deterioration in the handling characteristics of the corresponding composition.

Component (a) is exemplified by the following:
trimethoxysiloxy-endblocked dimethylpolysiloxanes,
trimethoxysiloxy-endblocked dimethylsiloxane-methylphenylsiloxane copolymers,
triethoxysiloxy-endblocked dimethylpolysiloxanes,
tripropoxysiloxy-endblocked dimethylpolysiloxanes,
methyldimethoxysiloxy-endblocked dimethylpolysiloxanes,
methyldiethoxysiloxy-endblocked dimethylpolysiloxanes,
methyldimethoxysiloxy-endblocked dimethylsiloxane-methylphenylsiloxane copolymers,
trimethoxysilylethyldimethylsiloxy-endblocked dimethylpolysiloxanes,
triethoxysilylethyldimethylsiloxy-endblocked dimethylpolysiloxanes,
trimethoxysilylpropyldimethylsiloxy-endblocked dimethylpolysiloxanes,
trimethoxysilylethyldimethylsiloxy-endblocked dimethylsiloxane-methylphenylsiloxane copolymers,
methyldimethoxysilylethyldimethylsiloxy-endblocked dimethylpolysiloxanes,
methyldimethoxysilylethyldimethylsiloxy-endblocked dimethylsiloxane-methylphenylsiloxane copolymers,
trimethylsiloxy-endblocked dimethylsiloxane-methyl(trimethoxysilylethyl)siloxane copolymers,
trimethylsiloxy-endblocked dimethylsiloxane-methyl(triethoxysilylethyl)siloxane copolymers, and
trimethoxysilylethyldimethylsiloxy-endblocked dimethylsiloxane-methyl(trimethylsilylethyl)siloxane copolymers.

Component (a) may consist of a single such alkoxy-substituted organopolysiloxane or a combination of two or more of these alkoxy-substituted organopolysiloxanes.

Component (b) should contain an average of at least two silicon-bonded alkenyl groups per molecule. The resulting composition will not evidence an acceptable cure when component (b) contains an average of less than two silicon-bonded alkenyl groups per molecule. The molecular structure of component (b) is exemplified by straight chain, partially branched straight chain, branched, cyclic, and resin structures. The silicon-bonded alkenyl in component (b) is exemplified by vinyl, allyl, butenyl, pentenyl, and hexenyl, wherein vinyl is preferred. The alkenyl can be bonded at terminal or nonterminal position on the molecular chain, but bonding at the molecular chain terminals is preferred for the good reactivity afforded thereby. The non-alkenyl silicon-bonded groups in component (b) are exemplified by alkyl groups such as methyl, ethyl, propyl, butyl, pentyl, hexyl, heptyl, octyl, nonyl, decyl, octadecyl, and so forth; cycloalkyl groups such as cyclopentyl, cyclohexyl, and so forth; aryl groups such as phenyl, tolyl, xylyl, naphthyl, and so forth; aralkyl groups such as benzyl, phenethyl, phenylpropyl, and so forth; and haloalkyl groups such as 3-chloropropyl, 3,3,3-trifluoropropyl, and so forth. The preferred non-alkoxy silicon-bonded groups are methyl and phenyl. The viscosity of component (b) at 25° C. should be from 20 to 200,000 mPa.s and is preferably from 100 to 100,000 mPa.s. A viscosity at 25° C. below 20 mPa.s leads to a decline in the physical properties of the ultimately obtained cured product. Viscosities in excess of 200,000 mPa.s lead to a deterioration in the handling characteristics of the corresponding composition.

Component (b) is exemplified by
trimethylsiloxy-endblocked dimethylsiloxane-methylvinylsiloxane copolymers;
trimethylsiloxy-endblocked methylvinylpolysiloxanes;
trimethylsiloxy-endblocked dimethylsiloxane-methylvinylsiloxane-methylphenylsiloxane copolymers;
dimethylvinylsiloxy-endblocked dimethylpolysiloxanes;
dimethylvinylsiloxy-endblocked dimethylsiloxane-methylvinylsiloxane copolymers;
dimethylvinylsiloxy-endblocked dimethylsiloxane-methylvinylsiloxane-methylphenylsiloxane copolymers;
organopolysiloxanes composed of the $(CH_2=CH)(CH_3)_2SiO_{1/2}$ and $SiO_{4/2}$ units; organopolysiloxanes composed of the $(CH_3)_3SiO_{1/2}$, $(CH_2=CH)(CH_3)_2SiO_{1/2}$, and $SiO_{4/2}$ units; and
organopolysiloxanes composed of the $(CH_3)_3SiO_{1/2}$, $(CH_2=CH)(CH_3)_2SiO_{1/2}$, $(CH_3)_2SiO_{2/2}$, and $SiO_{4/2}$ units.

Component (b) may consist of a single such organopolysiloxane or a combination of two or more of these organopolysiloxanes.

Component (a) should constitute from 5 to 95 weight % of component (A) with component (b) making up the remaining weight %. The presence of less than 5 weight % component (a) in component (A) leads to an impairment in the wire bondability to the semiconductor chip and lead frame and an impairment of the moisture resistance of the semiconductor device. The presence of more than 95 weight % causes the resulting composition to have a slow cure.

The organopolysiloxane (B) undergoes an addition reaction with component (b) and thereby crosslinks component (b). Component (B) should contain an average of at least two silicon-bonded hydrogen atoms per molecule: the resulting composition will suffer from such problems as an unsatisfactory cure or a slow cure when component (B) contains an average of less than two silicon-bonded hydrogen atoms per molecule. The molecular structure of component (B) is exemplified by straight chain, partially branched straight chain, cyclic, and resin structures. The silicon-bonded hydrogen may be bonded in terminal or nonterminal position on the molecular chain. The silicon-bonded groups in component (B) other than hydrogen are exemplified by alkyl groups such as methyl, ethyl, propyl, butyl, pentyl, hexyl, heptyl, octyl, nonyl, decyl, octadecyl, etc.; cycloalkyl groups such as cyclopentyl, cyclohexyl, and so forth; aryl groups such as phenyl, tolyl, xylyl, naphthyl, and so forth; aralkyl groups such as benzyl, phenethyl, phenylpropyl, and so forth; and haloalkyl groups such as 3-chloropropyl, 3,3,3-trifluoropropyl, and so forth. Methyl and phenyl are preferred here. Other groups that may be present in component (B) on an optional basis are, for example, silicon-bonded alkoxy groups, epoxy-functional monovalent organic groups, and acrylic-functional monovalent organic groups. The silicon-bonded alkoxy groups are exemplified by the same alkoxy groups as elaborated above. The epoxy-functional monovalent organic groups are exemplified by oxiranylalkyl groups such as 4-oxiranylbutyl, 8-oxiranyloctyl, and so forth; by glycidoxyalkyl groups such as 3-glycidoxypropyl, 4-glycidoxybutyl, and so forth; and by the 2-(3,4-epoxycyclohexyl)ethyl group. The acrylic-functional monovalent organic groups are exemplified by 3-methacryloxypropyl and 4-methacryloxybutyl. Component (B) should have a viscosity at 25° C. of 2 to 20,000 mPa.s. When component (B) has a viscosity at 25° C. below 2 mPa.s, it becomes so volatile that the resulting composition will have an unstable make up. The handling characteristics of the composition are poor when component (B) has a viscosity at 25° C. in excess of 20,000 mPa.s.

Component (B) is exemplified by
trimethylsiloxy-endblocked methylhydrogenpolysiloxanes;
trimethylsiloxy-endblocked dimethylsiloxane-methylhydrogensiloxane copolymers;
dimethylhydrogensiloxy-endblocked dimethylpolysiloxanes;
dimethylhydrogensiloxy-endblocked dimethylsiloxane-methylhydrogensiloxane copolymers;
organopolysiloxanes composed of the $(CH_3)_2HSiO_{1/2}$ and $SiO_{4/2}$ units;
organopolysiloxanes composed of the $(CH_3)_3SiO_{1/2}$, $(CH_3)_2HSiO_{1/2}$, and $SiO_{4/2}$ units; and
organopolysiloxanes composed of the $(CH_3)_3SiO_{1/2}$, $(CH_3)_2HSiO_{1/2}$, $(CH_3)_2SiO_{2/2}$, and $SiO_{4/2}$ units.

Examples of the silicon-bonded alkoxy-functional organopolysiloxane are trimethylsiloxy-endblocked methylhydrogensiloxane-methyl(trimethoxysilylethyl)siloxane copolymers, trimethylsiloxy-endblocked dimethylsiloxane-methylhydrogensiloxane-methyl(trimethoxysilylethyl)siloxane copolymers, cyclic methylhydrogensiloxane-methyl(trimethoxysilylethyl)siloxane copolymers, and cyclic dimethylsiloxane-methylhydrogensiloxane-methyl(trimethoxysilylethyl)siloxane copolymers.

Examples of organopolysiloxane containing both silicon-bonded alkoxy and epoxy-functionalized monovalent organic groups are trimethylsiloxy-endblocked methylhydrogensiloxane-methyl(trimethoxysilylethyl)siloxane-methyl(3-glycidoxypropyl)siloxane copolymers, trimethylsiloxy-endblocked dimethylsiloxane-methylhydrogensiloxane-methyl(trimethoxysilylethyl)siloxane-methyl(3-glycidoxypropyl)siloxane copolymers, cyclic methylhydrogensiloxane-methyl(trimethoxysilylethyl)siloxane-methyl(3-glycidoxypropyl)siloxane copolymers, and cyclic dimethylsiloxane-methylhydrogensiloxane-methyl(trimethoxysilylethyl)siloxane-methyl(3-glycidoxypropyl)siloxane copolymers.

Component (B) may consist of a single such organopolysiloxane or a combination of two or more of these organopolysiloxanes.

Component (B) should be added in an amount that affords a value from 0.3 to 20 for the molar ratio of silicon-bonded hydrogen atoms in component (B) to silicon-bonded alkenyl groups in component (b). When this molar ratio falls below 0.3, the resulting composition will not manifest an acceptable cure. When this molar ratio exceeds 20, the ultimately obtained cured product will exhibit diminished physical properties.

The condensation reaction catalyst (C) is a catalyst that accelerates the condensation reaction of component (a). Component (C) is exemplified by organotitanium condensation reaction catalysts, organozirconium condensation reaction catalysts, and organoaluminum condensation reaction catalysts. The organotitanium condensation reaction catalysts are exemplified by organotitanate esters such as tetrabutyl titanate, tetraisopropyl titanate, and so forth, and by organotitanium chelate compounds such as diisopropoxybis(acetylacetate)titanium, diisopropoxybis(ethyl acetoacetate)titanium, and so forth. The organozirconium condensation reaction catalysts are exemplified by organozirconium esters such as zirconium tetrapropylate, zirconium tetrabutylate, and so forth, and by organozirconium chelate compounds such as zirconium diacetate, zirconium tetra(acetylacetonate), tributoxyzirconium acetylacetonate, dibutoxyzirconium bis(acetylacetonate), tributoxyzirconium acetoacetate, dibutoxyzirconium acetylacetonato(ethyl acetoacetate), and the like. The organoaluminum condensation reaction catalysts are exemplified by organoaluminum esters such as aluminum triethylate, aluminum triisopropylate, aluminum tri(sec-butylate), mono(sec-butoxy)aluminum diisopropylate, and so forth, and by organoaluminum chelate compounds such as diisopropoxyaluminum (ethyl acetoacetate), aluminum tris(ethyl acetoacetate), aluminum bis(ethyl acetoacetate)monoacetylacetonate, aluminum tris(acetylacetonate), and so forth. These catalysts may be used individually or in combinations of two or more as component (C).

Component (C) is used at 0.01 to 10 weight parts and preferably at 0.1 to 5 weight parts, in each case per 100 weight parts component (A). The use of less than 0.01 weight part component (C) per 100 weight parts component (A) leads to the problems of impairment of wire bondability to the semiconductor chip and lead frame and impairment of the moisture resistance of the semiconductor device. The use of more than 10 weight parts leads to such problems as an impaired storage stability and impaired handling characteristics for the resulting composition.

The platinum catalyst (D) is a catalyst that accelerates the addition reaction between components (b) and (B), and it is exemplified by platinum black, platinum-on-active carbon, platinum-on-silica micropowder, chloroplatinic acid, alcohol solutions of chloroplatinic acid, platinum-olefin complexes, platinum-vinylsiloxane complexes, and microparticulate catalysts comprising thermoplastic resin containing a platinum catalyst as listed above. This thermoplastic resin is exemplified by silicone resins, polycarbonate resins, acrylic resins, nylon resins, and polyester resins. Moreover, the thermoplastic resin preferably has a softening point from 5° C. to 200° C. and preferably has a particle size from 0.01 to 10 micrometers. Component (D) is added in a catalytic amount. In specific terms, it is preferably added in an amount that provides from 0.01 to 1,000 weight-ppm and particularly preferably from 0.5 to 200 weight-ppm, in each case as platinum metal atoms in component (D) based on the present composition.

The first-named curable organopolysiloxane composition is prepared by mixing components (A) to (D) to homogeneity. However, in order to improve its adherence the composition may optionally contain an organosilicon compound that bears silicon-bonded alkoxy, epoxy-functional monovalent organic, and silicon-bonded alkenyl groups. Such an organopolysiloxane is exemplified by 3-glycidoxypropyldimethoxysiloxy-endblocked methylvinylpolysiloxanes, 3-glycidoxypropyldimethoxysiloxy-endblocked dimethylsiloxane-methylvinylsiloxane copolymers, 3-glycidoxypropyldiethoxysiloxy-endblocked methylvinylpolysiloxanes, and 3-glycidoxypropyidiethoxysiloxy-endblocked dimethylsiloxane-methylvinylsiloxane copolymers. The described organosilicon compound is preferably added at from 0.01 to 20 weight parts per 100 weight parts component (A).

The organopolysiloxane composition named second above will now be considered in detail.

Component (A'), which is the base or main ingredient of this composition, is organopolysiloxane that contains an average of at least two silicon-bonded alkenyl groups per molecule and may or may not contain any silicon-bonded alkoxy groups. Component (A') must contain an average of at least two silicon-bonded alkenyl groups per molecule: the resulting composition will not evidence an acceptable cure when component (A') contains an average of less than two silicon-bonded alkenyl groups per molecule. The molecular structure of component (A') is exemplified by straight chain, partially branched straight chain, and branched chain structures with straight chain structures being specifically preferred. The silicon-bonded alkenyl in component (A') is exemplified by vinyl, allyl, butenyl, pentenyl, hexenyl, and heptenyl, wherein vinyl is preferred. The alkenyl can be bonded at terminal or nonterminal position on the molecular chain. The non-alkenyl silicon-bonded groups in component (A') are exemplified by alkyl groups such as methyl, ethyl, propyl, butyl, pentyl, hexyl, heptyl, octyl, nonyl, decyl, octadecyl, and so forth; cycloalkyl groups such as cyclopentyl, cyclohexyl, and so forth; aryl groups such as phenyl, tolyl, xylyl, naphthyl, and so forth; aralkyl groups such as benzyl, phenethyl, phenylpropyl, and so forth; haloalkyl groups such as 3-chloropropyl, 3,3,3-trifluoropropyl, and so forth; and alkoxy groups such as methoxy, ethoxy, propoxy, butoxy, methoxymethoxy, methoxyethoxy, and so forth. Other groups which may also be present in component (A') on an optional basis are, for example, epoxy-functional monovalent organic groups and acrylic-functional monovalent organic groups. The epoxy-functional monovalent organic groups are exemplified by the same groups as elaborated above, and the acrylic-functional monovalent organic groups are likewise exemplified by the same groups as elaborated above. When component (B') contains an average of less than two silicon-bonded alkoxy groups per molecule, component (A') must an average of at least 2 silicon-bonded alkoxy groups per molecule. The viscosity of component (A') at 25° C. should be from 20 to 200,000 mPa.s and is preferably from 100 to 100,000 mPa.s. A viscosity at 25° C. below 20 mPa.s leads to a decline in the physical properties of the ultimately obtained cured product. Viscosities in excess of 200,000 mPa.s lead to a deterioration in the handling characteristics of the corresponding composition.

Component (A') is exemplified by the component (b) organopolysiloxane described above. For the case of organopolysiloxane also containing silicon-bonded alkoxy, component (A') is exemplified as follows:

trimethoxysiloxy-endblocked dimethylsiloxane-methylvinylsiloxane copolymers,
trimethoxysiloxy-endblocked dimethylsiloxane-methylvinylsiloxane-methylphenylsiloxane copolymers,
triethoxysiloxy-endblocked dimethylsiloxane-methylvinylsiloxane copolymers,
tripropoxysiloxy-endblocked dimethylsiloxane-methylvinylsiloxane copolymers,
methyldimethoxysiloxy-endblocked dimethylsiloxane-methylvinylsiloxane copolymers,
methyldiethoxysiloxy-endblocked dimethylsiloxane-methylvinylsiloxane copolymers,
methyldimethoxysiloxy-endblocked dimethylsiloxane-methylvinylsiloxane-methylphenylsiloxane copolymers,
trimethylsiloxy-endblocked dimethylsiloxane-methylvinylsiloxane-methyl(trimethoxysilylethyl)siloxane copolymers,
trimethylsiloxy-endblocked dimethylsiloxane-methylvinylsiloxane-methyl(triethoxysilylethyl)siloxane copolymers,
trimethoxysilylethyldimethylsiloxy-endblocked dimethylsiloxane-methylvinylsiloxane-methyl(trimethylsilylethyl)siloxane copolymers, and
the organopolysiloxane with the following formula.

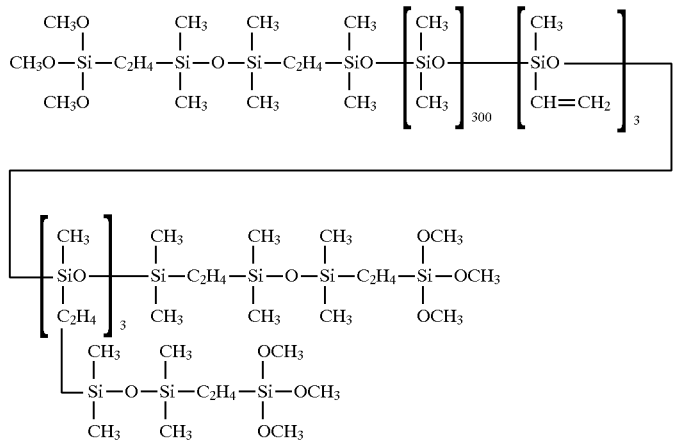

For the case of organopolysiloxane also containing silicon-bonded alkoxy and epoxy-functional monovalent organic groups, component (A') is exemplified as follows:

3-glycidoxypropyldimethoxysiloxy-endblocked methylvinylpolysiloxanes,
3-glycidoxypropyldimethoxysiloxy-endblocked dimethylsiloxane-methylvinylsiloxane copolymers,
3-glycidoxypropyidiethoxysiloxy-endblocked methylvinylpolysiloxanes,
3-glycidoxypropyldiethoxysiloxy-endblocked dimethylsiloxane-methylvinylsiloxane copolymers, trimethylsiloxy-endblocked methylvinylsiloxane-methyl (trimethoxysilylethyl)siloxane-methyl (3-glycidoxypropyl) siloxane copolymers, and trimethylsiloxy-endblocked dimethylsiloxane-methylvinylsiloxane-methyl(trimethoxysilylethyl) siloxane-methyl(3-glycidoxypropyl) siloxane copolymers.

Component (A') may consist of a single such organopolysiloxane or a combination of two or more of these organopolysiloxanes.

A component (A') that contains an average of at least two silicon-bonded alkoxy groups per molecule can be prepared, for example, by the platinum-catalyzed substoichiometric addition of an organosilicon compound functionalized with both Si-bonded alkoxy and Si-bonded hydrogen to organopolysiloxane containing at least 3 silicon-bonded alkenyl groups in each molecule, or by running a condensation reaction in the presence of a condensation reaction catalyst between organopolysiloxane having in each molecule at least 2 silicon-bonded alkenyl and silanol and an organosilicon compound having at least 2 silicon-bonded alkoxy in each molecule. The following are examples of the organosilicon compound functionalized with both Si-bonded alkoxy and Si-bonded hydrogen: trimethoxysilane, triethoxysilane, tripropoxysilane, methyldimethoxysilane, organosilicon compound with the formula

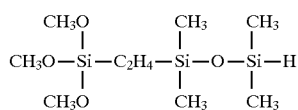

organosilicon compound with the formula

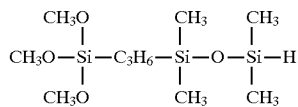

and organosilicon compound with the following formula.

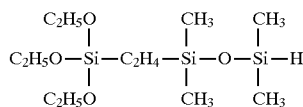

The following are examples of the organosilicon compound having at least 2 silicon-bonded alkoxy in each molecule: tetramethoxysilane, tetraethoxysilane, tetrapropxysilane, methyltrimethoxysilane, ethyltrimethoxysilane, methyltriethoxysilane, hexamethoxydisilylethane, hexamethoxydisilylpropane, and hexamethoxydisiloxane.

Component (B') addition reacts with and thereby crosslinks component (A'). Component (B') is an organopolysiloxane that contains an average of at least two silicon-bonded hydrogen atoms per molecule and that may or may not contain any silicon-bonded alkoxy groups. Component (B') should contain an average of at least two silicon-bonded hydrogen atoms per molecule: the resulting composition will not undergo a satisfactory cure when component (B') contains an average of less than two silicon-bonded hydrogen atoms per molecule. The molecular structure of component (B') is exemplified by straight chain, partially branched straight chain, cyclic, and resin structures. The silicon-bonded hydrogen may be bonded at terminal or nonterminal position along the molecular chain. The silicon-bonded groups in component (B') other than hydrogen are exemplified by alkyl groups such as methyl, ethyl, propyl, butyl, pentyl, hexyl, heptyl, octyl, nonyl, decyl, octadecyl, and so forth; cycloalkyl groups such as cyclopentyl, cyclohexyl, and so forth; aryl groups such as phenyl, tolyl, xylyl, naphthyl, and so forth; aralkyl groups such as benzyl, phenethyl, phenylpropyl, and so forth; haloalkyl groups such as 3-chloropropyl, 3,3,3-trifluoropropyl, and so forth; and alkoxy groups such as methoxy, ethoxy, propoxy, butoxy, methoxymethoxy, methoxyethoxy, and so forth. Other groups which may also be present in component (B') on an optional basis are, for example, epoxy-functional monovalent organic groups and acrylic-functional monovalent organic groups. The epoxy-functional monovalent organic groups are exemplified by the same groups as elaborated above, and the acrylic-functional monovalent organic groups are likewise exemplified by the same groups as elaborated above. When component (A') contains an average of less than two silicon-bonded alkoxy groups per molecule, component (B') must then contain an average of at least two silicon-bonded alkoxy groups per molecule. The viscosity of component (B') at 25° C. should be from 2 to 20,000 mPa.s. When component (B') has a viscosity at 25° C. below 2 mPa.s, it becomes so volatile that the resulting composition will have an unstable make up. The handling characteristics of the composition are poor when component (B') has a viscosity at 25° C. in excess of 20,000 mPa.s. The subject component (B') is exemplified by the same organopolysiloxanes as provided for component (B) above.

A component (B') containing an average of at least two silicon-bonded alkoxy groups in each molecule can be synthesized, for example, by the platinum-catalyzed substoichiometric addition of an organosilicon compound functionalized with both Si-bonded alkenyl and Si-bonded alkoxy to organopolysiloxane containing at least 3 silicon-bonded hydrogen in each molecule. The organosilicon compound functionalized with both Si-bonded alkenyl and Si-bonded alkoxy is exemplified by the following: vinyltrimethoxysilane, allyltrimethoxysilane, vinyltriethoxysilane, vinyltripropoxysilane, methylvinyldimethoxysilane, organosilicon compound with the formula

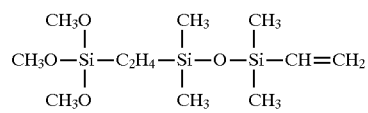

and organosilicon compound with the following formula.

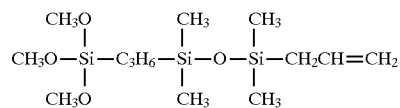

Component (B') should be added in an amount that affords a value from 0.3 to 20 for the molar ratio of silicon-bonded hydrogen in component (B') to silicon-bonded alkenyl in component (A'). When this molar ratio falls below 0.3, the resulting composition will not manifest an acceptable cure. When this molar ratio exceeds 20, the ultimately obtained cured product will exhibit diminished physical properties.

The condensation reaction catalyst (C) is a catalyst that accelerates the condensation reaction of component (A') and/or component (B'), and this catalyst is exemplified by the same catalysts provided as examples above. Component (C) is used at 0.01 to 10 weight parts and preferably at 0.1 to 5 weight parts, in each case per 100 weight parts component (A'). The use of less than 0.01 weight part component (C) per 100 weight parts component (A') leads to the problems of impairment of wire bondability to the semiconductor chip and lead frame and impairment of the moisture resistance of the semiconductor device. The use of more than 10 weight parts leads to such problems as an impaired storage stability and impaired handling characteristics for the resulting composition.

The platinum catalyst (D) is a catalyst that accelerates the addition reaction between components (A') and (B'), and it is exemplified by the same catalysts provided as examples above. Component (D) is added in a catalytic amount. In specific terms, it is preferably added in an amount that provides from 0.01 to 1,000 weight-ppm and particularly preferably from 0.5 to 200 weight-ppm, in each case as platinum metal atoms in component (D) based on the present composition.

At least one of components (A') and (B') in the second-named composition must contain an average of at least two silicon-bonded alkoxy groups in each molecule. The problems of impaired wire bondability to the semiconductor chip and lead frame and impaired moisture resistance by the semiconductor device will arise when components (A') and (B') both contain an average of less than two silicon-bonded alkoxy group per molecule.

Both of these compositions may optionally contain an electrically conductive filler (E). The conductive filler (E) is the component that imparts the excellent electrical conductivity to the ultimately obtained silicone rubber. Component (E) is exemplified by metal micropowders such as those of gold, silver, nickel, copper, and the like, and by micropowders, such as those of ceramics, glass, quartz, organic resins, etc., whose surface has been vapor-deposited or plated with a metal such as gold, silver, nickel, copper, etc. In order to obtain a highly conductive silicone rubber with a volume resistivity no greater than 0.1 ohm-cm, the component (E) in the subject conductive silicone rubber composition is preferably gold micropowder or silver micropowder and is preferably substantially silver micropowder. The morphology of the silver micropowder is exemplified by spherical, flake, and dendritic flake. When it is desired to obtain a highly conductive silicone rubber with a volume resistivity no greater than $0.1 \times 10^{-3}$ ohm-cm, flake and dendritic flake morphologies are specifically preferred for the silver micropowder, with mixtures of flake silver micropowder and dendritic flake silver micropowder being particularly preferred for achieving this goal. In this case, the flake silver micropowder/dendritic flake silver micropowder weight ratio is preferably from 80/20 to 20/80. The average particle size of the subject silver micropowders is preferably from 1 to 10 micrometers.

Component (E) should be present at from 50 to 2,000 weight parts and preferably at from 300 to 1,000 weight parts, in each case per 100 weight parts component (A) or 100 weight parts component (A'). A satisfactory conductivity cannot be imparted to the ultimately obtained silicone rubber when component (E) is present at less than 50 weight parts per 100 weight parts component (A) or per 100 weight parts component (A') . The resulting composition suffers from a major impairment in its handling characteristics when component (E) is present at more than 2,000 weight parts.

Both of these compositions may optionally contain an alkoxy-containing compound selected from the group consisting of alkoxysilane with the general formula

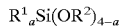

where $R^1$ is selected from the group consisting of monovalent hydrocarbon groups, epoxy-functional monovalent organic groups, and acrylic-functional monovalent organic groups; $R^2$ is alkyl or alkoxyalkyl; and a is 0, 1, or 2; and partial hydrolysis condensates thereof, which is added for such purposes as crosslinking the Si-bonded alkoxy-functional organopolysiloxane and improving the handling characteristics and adherence of the compositions. $R^1$ in the preceding formula is at least one selection from the set consisting of monovalent hydrocarbon groups, epoxy-functional monovalent organic groups, and acrylic-functional monovalent organic groups. Said monovalent hydrocarbon groups are exemplified by alkyl groups such as methyl, ethyl, propyl, butyl, pentyl, hexyl, heptyl, octyl, nonyl, decyl, octadecyl, and so forth; cycloalkyl groups such as cyclopentyl, cyclohexyl, and so forth; alkenyl groups such as vinyl, allyl, and so forth; aryl groups such as phenyl, tolyl, xylyl, naphthyl, and so forth; aralkyl groups such as benzyl, phenethyl, phenylpropyl, and so forth; and haloalkyl groups such as 3-chloropropyl, 3,3,3-trifluoropropyl, and so forth. The epoxy-functional monovalent organic group is exemplified by oxiranylalkyl groups such as 4-oxiranylbutyl, 8-oxiranyloctyl, and so forth; by glycidoxy-alkyl groups such as 3-glycidoxypropyl, 4-glycidoxybutyl, and so forth; and by the 2-(3,4-epoxycyclohexyl)ethyl group. The acrylic-functional monovalent organic group is exemplified by 3-methacryloxypropyl and 4-methacryloxybutyl. $R^2$ is alkyl or alkoxyalkyl, wherein the alkyl is exemplified by methyl, ethyl, propyl, butyl, pentyl, hexyl, heptyl, octyl, nonyl, decyl, octadecyl, and so forth, and the alkoxyalkyl is exemplified by methoxyethyl, ethoxyethyl, methoxypropyl, methoxybutyl, and so forth. The methoxy group is preferred. The subscript a has a value of 0, 1, or 2 wherein a value of 1 is preferred.

The subject alkoxysilane and partial hydrolysis condensate thereof are exemplified by alkoxysilanes such as tetramethoxysilane, tetraethoxysilane, methyl Cellosolve orthosilicate, methyltrimethoxysilane, methyltriethoxysilane, ethyltrimethoxysilane, vinyltrimethoxysilane, phenyltrimethoxysilane, methyltrimethoxyethoxysilane, dimethyldimethoxysilane, diphenyldimethoxysilane, and so forth; by epoxy-functional alkoxysilanes such as 4-oxiranylbutyltrimethoxysilane, 8-oxiranyloctyltrimethoxysilane, 3-glycidoxypropyltrimethoxysilane, 2-(3,4-epoxycyclohexyl)ethyltrimethoxysilane, and so forth; by acrylic-functional alkoxysilanes such as 3-methacryloxypropyltrimethoxysilane, 4-methacryloxybutyltrimethoxysilane, and so forth; and by the partial hydrolysis condensates of these alkoxysilanes. Only a single alkoxysilane or partial hydrolysis condensate thereof may be used, or a mixture of two or more different alkoxysilanes or partial hydrolysis condensates thereof may be employed.

The alkoxysilane or partial hydrolysis condensate thereof is added at 0.01 to 20 weight parts and preferably at 0.1 to 10 weight parts, in each case per 100 weight parts component (A) or (A'). The use of less than 0.01 weight part per 100 weight parts component (A) or (A') makes it quite difficult to obtain good adhesion. The use of more than 20 weight parts can cause various problems, such as an extremely slow cure by the corresponding composition, impairment of the wire bondability to the semiconductor chip and lead frame, and impairment of the moisture resistance of the semiconductor device.

In order to improve their adherence, the compositions under discussion may optionally contain components other than the above-described alkoxysilane or partial hydrolysis condensate thereof, for example, organosilicon compound containing silicon-bonded alkoxy and 1 silicon-bonded alkenyl or 1 silicon-bonded hydrogen in each molecule. The following are examples of the organosilicon compound containing silicon-bonded alkoxy and 1 silicon-bonded alkenyl or 1 silicon-bonded hydrogen in each molecule.

organopolysiloxane with the formula

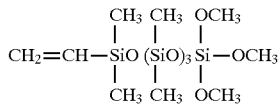

organopolysiloxane with the formula

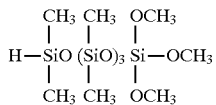

cyclic organopolysiloxane with the formula

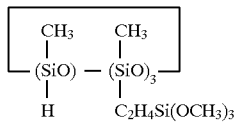

These organosilicon compounds may be used individually or in combinations of 2 or more selections. The subject organosilicon compound is preferably added at 0.01 to 20 weight parts and particularly preferably at 0.1 to 10 weight parts, in each case per 100 weight parts component (A) or (A'). When added at less than 0.01 weight part per 100 weight parts component (A') or (A), it becomes very difficult to obtain an acceptable adherence. The use of more than 20 weight parts can cause various problems, such as an extremely slow cure by the corresponding composition, impairment of the wire bondability to the semiconductor chip and lead frame, and impairment of the moisture resistance of the semiconductor device.

An addition reaction inhibitor can be added on an optional basis to either composition for the purpose of improving the handling characteristics of the particular composition. This addition reaction inhibitor is exemplified by acetylenic compounds such as 3-methyl-1-butyn-3-ol, 3,5-dimethyl-1-hexyn-3-ol, 3-phenyl-1-butyn-3-ol, and so forth; ene-yne compounds such as 3-methyl-3-penten-1-yne, 3,5-dimethyl-3-hexen-1-yne, and so forth; cycloalkenylsiloxanes such as 1,3,5,7-tetramethyl-1,3,5,7-tetravinylcyclotetrasiloxane, 1,3,5,7-tetramethyl-1,3,5,7-tetrahexenylcyclotetrasiloxane, and so forth; triazole compounds such as benzotriazole; and also phosphine compounds, mercaptan compounds, hydrazine compounds, and the like. The addition of the addition reaction inhibitor will vary with the conditions prevailing in the bonding operation, but in general the addition reaction inhibitor is preferably added at from 10 to 1,000 weight-ppm based on the present composition.

Each of the compositions under consideration can contain inorganic filler as an optional component, for example, fumed silica, wet-process silica micropowder, quartz micropowder, calcium carbonate micropowder, titanium dioxide micropowder, diatomaceous earth micropowder, aluminum oxide micropowder, aluminum hydroxide micropowder, zinc oxide micropowder, zinc carbonate micropowder, and so forth, or hydrophobic inorganic filler as afforded by treating the surface of the above-listed inorganic fillers with organoalkoxysilane such as methyltrimethoxysilane, organohalosilane such as trimethylchlorosilane, organosilazane such as hexamethyldisilazane, or siloxane oligomer such as hydroxyl-endblocked dimethylsiloxane oligomer, hydroxyl-endblocked methylphenylsiloxane oligomer, and hydroxyl-endblocked methylvinylsiloxane oligomer. Each composition can also contain, for example, organic solvent such as toluene, xylene, acetone, methyl ethyl ketone, methyl isobutyl ketone, hexane, heptane, and so forth; noncrosslinking organopolysiloxane such as trimethylsiloxy-endblocked polydimethylsiloxane, trimethylsiloxy-endblocked polymethylphenylsiloxane, and so forth; flame retardants; heat stabilizers; plasticizers; thixotropy donors; adhesion promoters; and antimolds.

The silicone die attach adhesive according to the present invention can be prepared, for example, by preparing a homogeneous mixture of the above-described components (A), (B), (C), and (D) or components (A'), (B'), (C), and (D) along with any optional components. This silicone die attach adhesive makes possible a substantial reduction in the semiconductor device defect rate because it does not impair wire bondability to the semiconductor chip and lead frame after the semiconductor chip has been bonded to its substrate. A semiconductor chip can be bonded to its substrate using this silicone die attach adhesive by first applying the silicone die attach adhesive to the attachment site for the semiconductor chip on the substrate effecting intimate contact therewith by the semiconductor chip, and heating. Alternatively, the silicone die attach adhesive can first be applied to the semiconductor chip followed by effecting intimate contact between the loaded semiconductor chip and its substrate and heating. Temperatures of 50° C. to 300° C. are preferably used to cure this silicone die attach adhesive, while temperatures of 100° C. to 250° C. are particularly preferred. The cured product afforded thereby can be, for example, a gel, rubber, or resin. Rubbers are specifically preferred for their capacity to thoroughly relax the stresses generated in the semiconductor chip. In this context the cured rubber preferably has a durometer (JIS A) according to JIS K 6301 of at least 5, more preferably from 10 to 95, and even more preferably from 10 to 60.

DETAILED DESCRIPTION OF THE DRAWING

The semiconductor device according to the present invention will now be explained in detail with reference to the appended drawings.

As shown in FIG. 1, the characteristic feature of the semiconductor device according to the present invention is that the semiconductor chip 1 is bonded to the tab 2 (substrate for mounting of the semiconductor chip) by the silicone die attach adhesive. This semiconductor device can be, for example, a diode, transistor, thyristor, monolithic IC, hybrid IC, LSI, or VLSI. The semiconductor chip 1 can be, for example, a diode chip, transistor chip, thyristor chip, monolithic IC chip, or the semiconductor chip in a hybrid IC. The material making up the tab 2 can be, for example, copper or an iron alloy. In addition, as shown in FIG. 2, the semiconductor device according to the present invention can use a circuit substrate 8 composed of a material such as ceramic, glass, etc., as the substrate for attachment of the semiconductor chip 1. Circuit interconnects 9 of a metal such as gold, silver, copper, etc., can be formed on the surface of this circuit substrate 8, and electrical elements 10 such as, for example, capacitors, resistors, coils, etc., can also be mounted on the surface of the circuit substrate 8.

The semiconductor device according to the present invention can be fabricated by heating to produce the cured material 3 while effecting intimate contact between the semiconductor chip 1 and the tab 2 or ceramic circuit substrate 8 with the above-described silicone die attach adhesive sandwiched in between. Fabrication then continues by wire bonding the aluminum bonding pads 4 elaborated on the top edges of the semiconductor chip 1 to the copper lead frame 5 or copper circuit interconnect 9 using gold bonding wires 6. Copper and aluminum bonding wires may be used, for example, in addition to gold bonding wires. The wire bonding technique can be, for example, thermocompression, ultrasound compression, and ultrasound thermocompression. The semiconductor chip 1 can be bonded with the silicone die attach adhesive to the tab 2 or ceramic circuit substrate 8, for example, by first coating the silicone die attach adhesive on the semiconductor chip 1 and then effecting intimate contact between this and the tab 2 or ceramic circuit substrate 8 and heating. Alternatively, the silicone die attach adhesive can first be coated on the tab 2 or ceramic circuit substrate 8 followed by effecting intimate contact of the semiconductor chip 1 therewith and heating. The heating temperature for the silicone die attach adhesive is preferably 50° C. to 300° C. and is particularly preferably from 100° C. to 250° C. Silicone rubber or silicone gel can then be formed on the surface of the semiconductor chip 1 in order to protect the semiconductor chip. In the semiconductor device under consideration, the semiconductor chip 1 is resin-sealed using a sealant resin 7, of which examples are epoxy resin, phenolic resin, and polyphenylene sulfide resin.

EXAMPLES

The curable organosiloxane composition which is usable as a silicone die attach adhesive, the electrically conductive silicone rubber composition and the semiconductor device according to the present invention will be explained in greater detail below through working examples. The viscosity values reported in the examples were measured at 25° C. The following methods were used in the examples for determination of the curability of the composition and durometer and conductivity of the cured product therefrom, for fabrication of the semiconductor devices, for evaluation of the wire bondability to the semiconductor chip and lead frame, for evaluation of the moisture resistance of the semiconductor devices, and for determination of delamination between the semiconductor chip and sealant resin.

Curability of the silicone die attach adhesive and durometer of the cured product therefrom The silicone die attach adhesive was stored in a sealed container at 25° C., and the time was measured until the viscosity had doubled from its starting value (use time). The silicone die attach adhesive was also coated out and held at 20° C. and 55% relative humidity, and the time necessary for the formation of a rubbery cured skin (the skinning over time, abbreviated in the table as SOT) was measured by touching the surface. Finally, the silicone die attach adhesive was heated for 30 minutes at 150° C. to give the cured product. The durometer of this cured product was measured using the JIS A hardness meter stipulated in JIS K 6301.

Fabrication of semiconductor devices and evaluation of the wire bondability

The semiconductor device depicted in FIG. 1 was fabricated. This semiconductor device used a 144-pin out lead frame and a semiconductor chip size of 10 mm×10 mm.

The semiconductor chip 1 was pressed onto the tab 2 with the silicone die attach adhesive sandwiched in between and this assembly was thereafter held for 5 hours at room temperature. This was followed by heating for 10 minutes at 200° C. to yield the cured material 3. The semiconductor device was then fabricated by wire bonding the aluminum bonding pads 4 elaborated on the top edges of the semiconductor chip 1 to the copper lead frame 5 using gold bonding wires 6. Wire bonding was carried out by ultrasound thermocompression (joining temperature of 160° C. to 250° C., load of 30 to 100 mg each). 20 such semiconductor devices were fabricated. The neck shape between the gold bonding wire 6 and the bonding pad 4 or copper lead frame 5 was investigated by microscopy, at which point the bonding status of the bonding wire 6 was investigated by pulling on the gold bonding wire 6. The wire bondability is reported as the proportion of defective connections by the bonding wires 6.

Evaluation of the moisture resistance of the semiconductor devices

Semiconductor devices were fabricated by resin-sealing semiconductor chips with well-joined bonding wires 6 using epoxy resin. 20 of these semiconductor devices were heated for the specified period of time in saturated steam at 2 atmospheres and 120° C. After this heating period electrical current was applied to the semiconductor devices and the leakage current across the copper lead frame 5 was measured. The moisture resistance of the semiconductor devices is reported as the proportion of defective (increased leakage current and presence of continuity defects) semiconductor devices.

Investigation of delamination between the semiconductor chip and sealing resin 20 epoxy resin-sealed semiconductor devices were held for 168 hours at 85° C./85% relative humidity and were thereafter heated by IR reflow at 245° C. This heating episode was followed by examination of the semiconductor devices using an acoustic microscope in order to screen for the presence of delamination produced between the semiconductor chip 1 and epoxy resin sealant. The reported value is the proportion of semiconductor devices in which this delamination appeared.

Example 1

The following were mixed to homogeneity to give a silicone die attach adhesive: 80 weight parts dimethylvinylsiloxy-endblocked dimethylpolysiloxane (viscosity of 2,000 mPa.s) with the formula

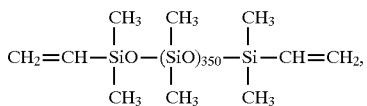

20 weight parts trimethoxysiloxy-endblocked dimethylpolysiloxane (viscosity of 5,000 mPa.s) with the formula

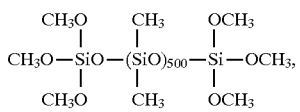

2 weight parts trimethylsiloxy-endblocked methylhydrogenpolysiloxane (viscosity of 20 mPa.s) with the formula

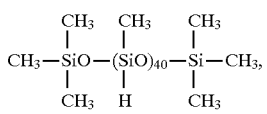

2.5 weight parts dimethylsiloxane-methylvinylsiloxane copolymer (viscosity of 50 mPa.s) with the formula

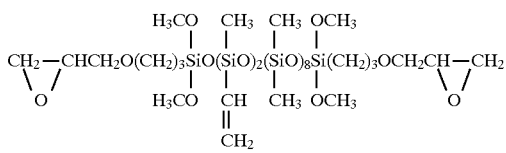

0.5 weight part vinyltrimethoxysilane, 0.5 weight part diisopropoxybis(ethyl acetoacetate)titanium, 7 weight parts hydrophobic fumed silica with a specific surface area of 200 m²/g (made hydrophobic by surface treatment with hexamethyldisilazane), a 1,1,3,3-tetramethyl-1,3-divinyldisiloxane complex of platinum in sufficient quantity to provide 5 weight-ppm platinum metal in the present composition, and 3-phenyl-1-butyn3-ol at 200 weight-ppm in the present composition. Semiconductor devices were then fabricated using this silicone die attach adhesive. The results of the various evaluations are reported in Table 1.

Example 2

A silicone die attach adhesive was prepared by mixing the following to homogeneity: 97.5 weight parts organopolysiloxane (viscosity of 2,500 mPa.s) with the formula

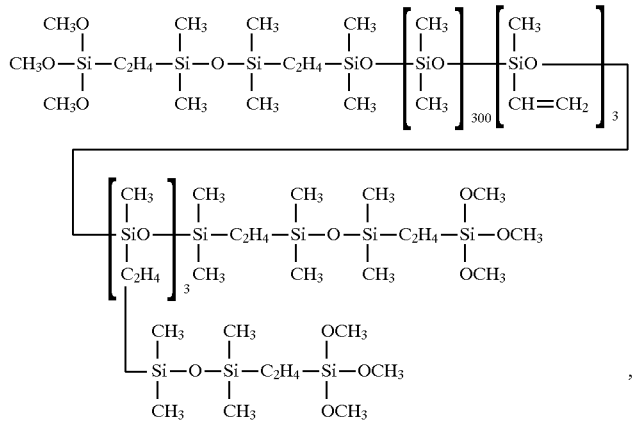

2.5 weight parts dimethylsiloxane-methylvinylsiloxane copolymer (viscosity of 50 mPa.s) with the formula

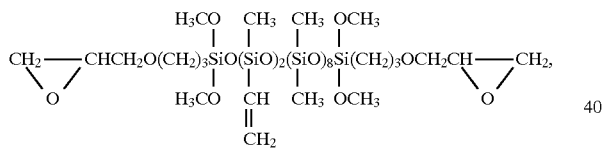

2 weight parts trimethylsiloxy-endblocked methylhydrogenpolysiloxane (viscosity of 20 mPa.s) with the formula

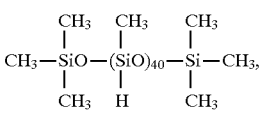

0.5 weight part vinyltrimethoxysilane, 0.5 weight part diisopropoxybis(ethyl acetoacetate)titanium, 7 weight parts hydrophobic fumed silica with a specific surface area of 200 m²/g (made hydrophobic by surface treatment with hexamethyldisilazane), a 1,1,3,3-tetramethyl-1,3-divinyldisiloxane complex of platinum in sufficient quantity to provide 5 weight-ppm platinum metal in the present composition, and 3-phenyl-1-butyn3-ol at 200 weight-ppm in the present composition. Semiconductor devices were then fabricated using this silicone die attach adhesive. The results of the various evaluations are reported in Table 1.

Example 3

A silicone die attach adhesive was prepared by mixing the following to homogeneity: 97.5 weight parts organopolysiloxane (viscosity of 2,500 mPa.s) with the formula

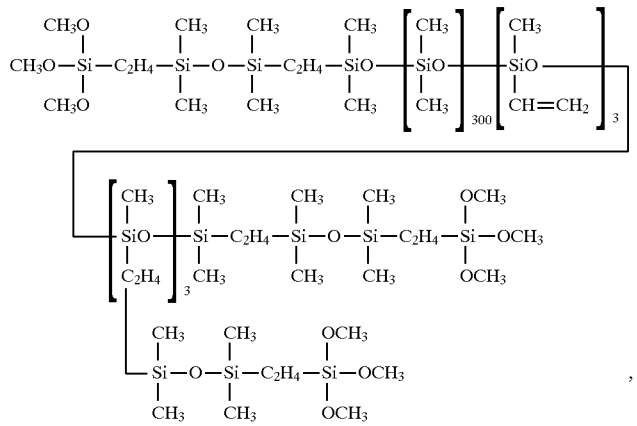

2.5 weight parts dimethylsiloxane-methylvinylsiloxane copolymer (viscosity of 50 mPa.s) with the formula

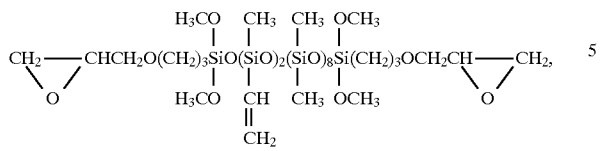

30 weight parts dimethylsiloxane-methylhydrogensiloxane-methyl(trimethoxysilylethyl)siloxane copolymer (viscosity of 40 mPa.s) with the following formula

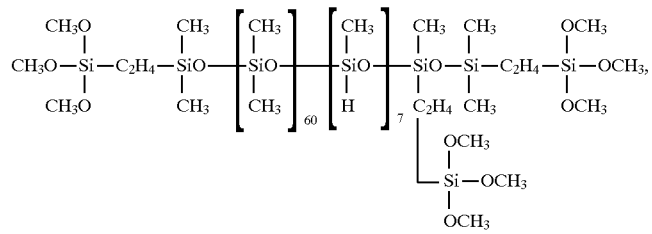

0.5 weight part vinyltrimethoxysilane, 0.5 weight part diisopropoxybis(ethyl acetoacetate)titanium, 7 weight parts hydrophobic fumed silica with a specific surface area of 200 m²/g (made hydrophobic by surface treatment with hexamethyldisilazane), a 1,1,3,3-tetramethyl-1,3-divinyldisiloxane complex of platinum in sufficient quantity to provide 5 weight-ppm platinum metal in the present composition, and 3-phenyl-1-butyn3-ol at 200 weight-ppm in the present composition. Semiconductor devices were then fabricated using this silicone die attach adhesive. The results of the various evaluations are reported in Table 1.

Example 4

A silicone die attach adhesive was prepared by mixing the following to homogeneity: 97.5 weight parts dimethylvinylsiloxy-endblocked dimethylpolysiloxane (viscosity of 2,000 mPa.s) with the formula

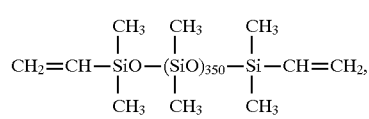

2.5 weight parts dimethylsiloxane-methylvinylsiloxane copolymer (viscosity of 50 mPa.s) with the formula

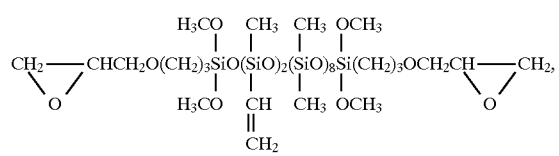

15 weight parts dimethylsiloxane-methylhydrogensiloxane-methyl(trimethoxysilylethyl)siloxane copolymer (viscosity of 40 mPa.s) with the following formula

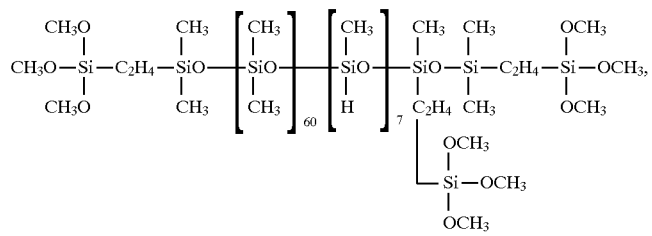

0.5 weight part methyltrimethoxysilane, 0.5 weight part diisopropoxybis(ethyl acetoacetate)titanium, 7 weight parts hydrophobic fumed silica with a specific surface area of 200 m²/g (made hydrophobic by surface treatment with hexamethyldisilazane), a 1,1,3,3-tetramethyl-1,3-divinyldisiloxane complex of platinum in sufficient quantity to provide 5 weight-ppm platinum metal in the present composition, and 3-phenyl-1-butyn-3-ol at 200 weight-ppm in the present composition. Semiconductor devices were then fabricated using this silicone die attach adhesive. The results of the various evaluations are reported in Table 1.

Example 5

A silicone die attach adhesive was prepared by mixing the following to homogeneity: 98.5 weight parts vinyldimethoxysiloxy-endblocked dimethylpolysiloxane (viscosity of 5,000 mPa.s) with the formula

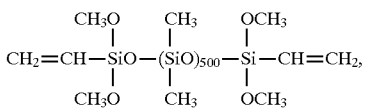

2.5 weight parts dimethylsiloxane-methylvinylsiloxane copolymer (viscosity of 50 mPa.s) with the formula

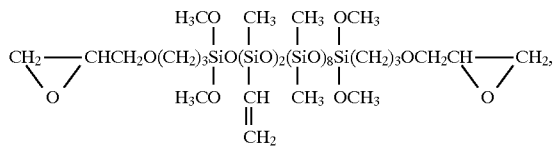

1.8 weight parts trimethylsiloxy-endblocked methylhydrogenpolysiloxane (viscosity of 20 mPa.s) with the formula

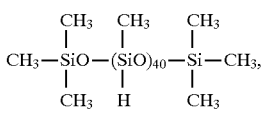

0.5 weight part vinyltrimethoxysilane, 0.5 weight part diisopropoxybis(ethyl acetoacetate)titanium, 7 weight parts hydrophobic fumed silica with a specific surface area of 200 m$^2$g (made hydrophobic by surface treatment with hexamethyldisilazane), a 1,1,3,3-tetramethyl-1,3-divinyldisiloxane complex of platinum in sufficient quantity to provide 5 weight-ppm platinum metal in the present composition, and 3-phenyl-1-butyn3-ol at 200 weight-ppm in the present composition. Semiconductor devices were then fabricated using this silicone die attach adhesive. The results of the various evaluations are reported in Table 1.

Comparative Example 1

A silicone die attach adhesive was prepared by mixing the following to homogeneity: 100 weight parts dimethylvinylsiloxy-endblocked dimethylpolysiloxane (viscosity of 2,000 mPa.s) with the formula

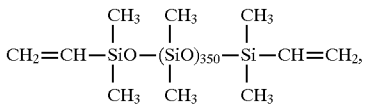

1.5 weight parts trimethylsiloxy-endblocked methylhydrogenpolysiloxane (viscosity of 20 mPa.s) with the formula

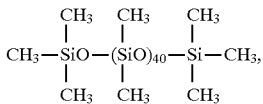

2.5 weight parts dimethylsiloxane-methylvinylsiloxane copolymer (viscosity of 50 mPa.s) with the formula

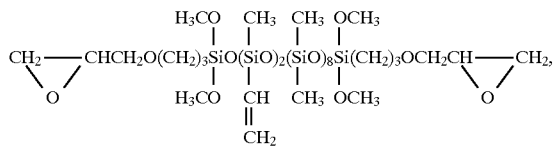

0.5 weight part vinyltrimethoxysilane, 7 weight parts hydrophobic fumed silica with a specific surface area of 200 m$^2$/g (made hydrophobic by surface treatment with hexamethyldisilazane), a 1,1,3,3-tetramethyl-1,3-divinyldisiloxane complex of platinum in sufficient quantity to provide 5 weight-ppm platinum metal in the present composition, and 3-phenyl-1-butyn-3-ol at 200 weight-ppm in the present composition. Semiconductor devices were then fabricated using this silicone die attach adhesive. The results of the various evaluations are reported in Table 1.

Curability of the conductive silicone rubber composition and durometer of the silicone rubber therefrom The conductive silicone rubber composition was stored in a sealed container at 25° C., and the time was measured until the viscosity had doubled from its starting value (use time). The composition was also coated out and held at 20° C. and 55% relative humidity, and the time necessary for the formation of a rubbery cured skin (the skinning over time, abbreviated in the table as SOT) was measured by touching the surface. Finally, the composition was heated for 30 minutes at 150° C. to give the silicone rubber. The durometer of this silicone rubber was measured using the JIS A hardness meter stipulated in JIS K 6301.

Conductivity of the silicone rubber

A silicone rubber sheet with a thickness of 1 mm was molded by heating the conductive silicone rubber composition for 30 minutes at 150° C. The conductivity of this silicone rubber was measured using a resistivity measurement instrument (K-705RL from Yugengaisha Kyowa Riken).

Fabrication of semiconductor devices and evaluation of the wire bondability

The semiconductor device depicted in FIG. 1 was fabricated. This semiconductor device used a 144-pin out lead frame and a semiconductor chip size of 10 mm×10 mm.

The semiconductor chip 1 was pressed onto the tab 2 with the conductive silicone rubber composition sandwiched in between and this assembly was thereafter held for 5 hours at room temperature. This was followed by heating for 10 minutes at 200° C. to yield the cured material 3. The semiconductor device was then fabricated by wire bonding the aluminum bonding pads 4 elaborated on the top edges of the semiconductor chip 1 to the copper lead frame 5 using gold bonding wires 6. Wire bonding was carried out by ultrasound thermocompression (joining temperature of 160° C. to 250° C., load of 30 to 100 mg each). 20 such semiconductor devices were fabricated. The neck shape between the gold bonding wire 6 and the bonding pad 4 or copper lead frame 5 was investigated by microscopy, at which point the bonding status of the bonding wire 6 was investigated by pulling on the gold bonding wire 6. The wire bondability is reported as the proportion of defective connections by the bonding wires 6.

Evaluation of the moisture resistance of the semiconductor devices

Semiconductor devices were fabricated by resin-sealing semiconductor chips with well-joined bonding wires 6 using epoxy resin. 20 of these semiconductor devices were heated for the specified period of time in saturated steam at 2 atmospheres and 120° C. After this heating period electrical current was applied to the semiconductor devices and the leakage current across the copper lead frame 5 was measured. The moisture resistance of the semiconductor devices is reported as the proportion of defective (increased leakage current and presence of continuity defects) semiconductor devices.

Investigation of delamination between the semiconductor chip and sealing resin 20 epoxy resin-sealed semiconductor devices were held for 168 hours at 85° C./85% relative humidity and were thereafter heated by IR reflow at 245° C. This heating episode was followed by examination of the semiconductor devices using an acoustic microscope in order to screen for the presence of delamination produced between the semiconductor chip 1 and epoxy resin sealant. The reported value is the proportion of semiconductor devices in which this delamination appeared.

Example 6

The following were mixed to homogeneity to give an electrically conductive silicone rubber composition: 80 parts by weight dimethylvinylsiloxy-endblocked dimethylpolysiloxane (viscosity of 2,000 mPa.s) with the formula

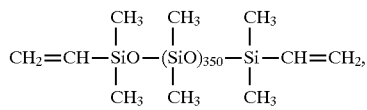

20 parts by weight trimethoxy-endblocked dimethylpolysiloxane (viscosity of 5,000 mPa.s) with the formula

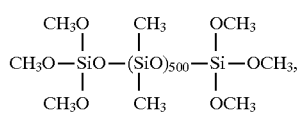

3 weight parts trimethylsiloxy-endblocked methylhydrogenpolysiloxane (viscosity of 20 mPa.s) with the formula

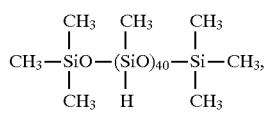

520 weight parts flake silver micropowder with an average particle size of 5 micrometers, 8 weight parts dimethylsiloxane-methylvinylsiloxane copolymer (viscosity of 50 mPa.s) with the formula

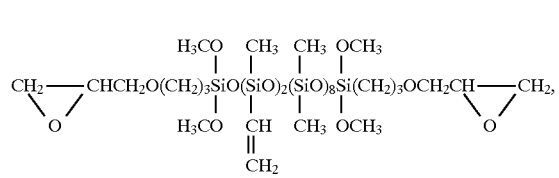

0.5 weight part vinyltrimethoxysilane, 0.5 weight part diisopropoxybis(ethyl acetoacetate)titanium, 7 weight parts hydrophobic fumed silica with a specific surface area of 200 m$^2$/g (made hydrophobic by surface treatment with hexamethyldisilazane), a 1,1,3,3-tetramethyl-1,3-divinyldisiloxane complex of platinum in sufficient quantity to provide 25 weight-ppm platinum metal in the present composition, and 3-phenyl-1-butyn-3-ol at 300 weight-ppm in the present composition. Semiconductor devices were then fabricated using this conductive silicone rubber composition. The results of the various evaluations are reported in Table 2.

Example 7

A conductive silicone rubber composition was prepared by mixing the following to homogeneity: 92 weight parts organopolysiloxane (viscosity of 2,500 mPa.s) with the formula

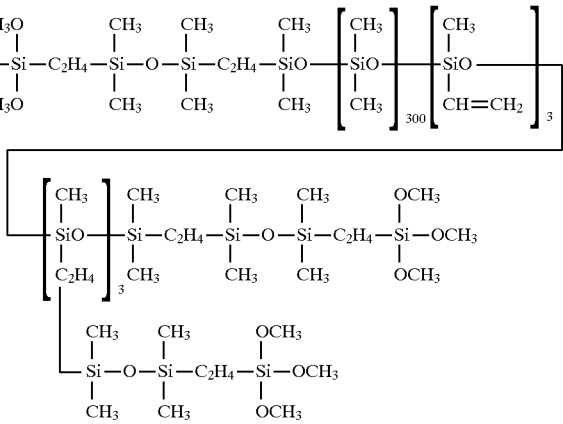

8 weight parts dimethylsiloxane-methylvinylsiloxane copolymer (viscosity of 50 mPa.s) with the formula

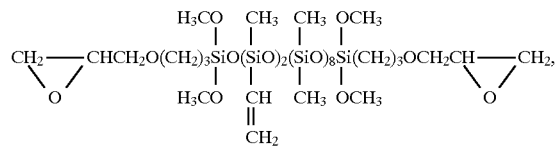

3.5 weight parts trimethylsiloxy-endblocked methylhydrogenpolysiloxane (viscosity of 20 mPa.s) with the formula

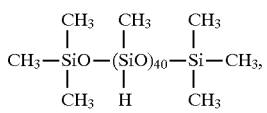

500 weight parts flake silver micropowder with an average particle size of 5 micrometers, 0.5 weight part vinyltrimethoxysilane, 0.5 weight part diisopropoxybis (ethyl acetoacetate)titanium, 7 weight parts hydrophobic fumed silica with a specific surface area of 200 m²/g (made hydrophobic by surface treatment with hexamethyldisilazane), a 1,1,3,3-tetramethyl-1,3-divinyldisiloxane complex of platinum in sufficient quantity to provide 25 weight-ppm platinum metal in the present composition, and 3-phenyl-1-butyn-3-ol at 300 weight-ppm in the present composition. Semiconductor devices were then fabricated using this conductive silicone rubber composition. The results of the various evaluations are reported in Table 2.

Example 8

A conductive silicone rubber composition was prepared by mixing the following to homogeneity: 83 weight parts organopolysiloxane (viscosity of 2,500 mPa.s) with the formula 650 weight parts flake silver micropowder with an average particle size of 5 micrometers, 0.5 weight part vinyltrimethoxysilane, 0.5 weight part diisopropoxybis (ethyl acetoacetate)titanium, 7 weight parts hydrophobic fumed silica with a specific surface area of 200 m²/g (made hydrophobic by surface treatment with hexamethyldisilazane), a 1,1,3,3-tetramethyl-1,3-divinyldisiloxane complex of platinum in sufficient quantity to provide 25 weight-ppm platinum metal in the present composition, and 3-phenyl-1-butyn-3-ol at 300 weight-ppm in the present composition. Semiconductor devices were then fabricated using this conductive silicone rubber composition. The results of the various evaluations are reported in Table 2.

Example 9

A conductive silicone rubber composition was prepared by mixing the following to homogeneity: 83 weight parts

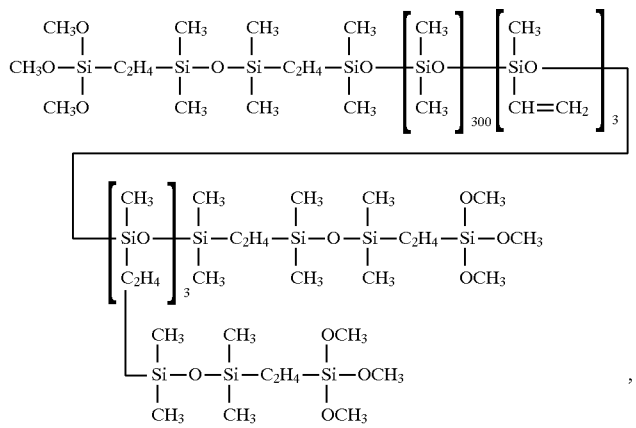

17 weight parts dimethylsiloxane-methylvinylsiloxane copolymer (viscosity of 50 mPa.s) with the formula dimethylvinylsiloxy-endblocked dimethylpolysiloxane (viscosity of 2,000 mPa.s) with the formula

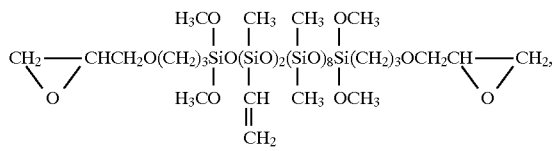 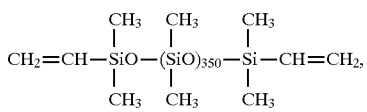

70 weight parts dimethylsiloxane-methylhydrogensiloxane-methyl (trimethoxysilylethyl)siloxane copolymer (viscosity of 40 mPa.s) with the following formula 17 weight parts dimethylsiloxane-methylvinylsiloxane copolymer (viscosity of 50 mPa.s) with the formula

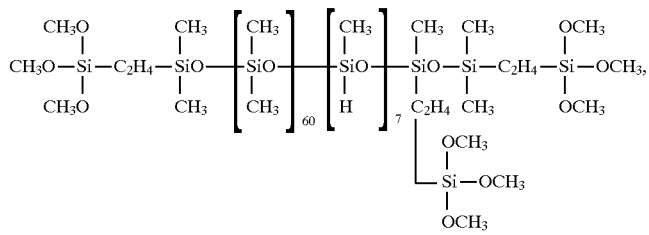

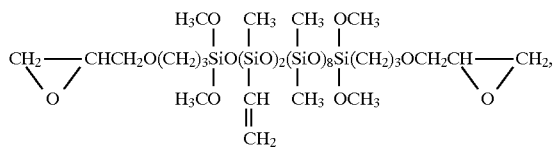

60 weight parts dimethylsiloxane-methylhydrogensiloxanemethyl (trimethoxysilylethyl) siloxane copolymer (viscosity of 40 mPa.s) with the following formula

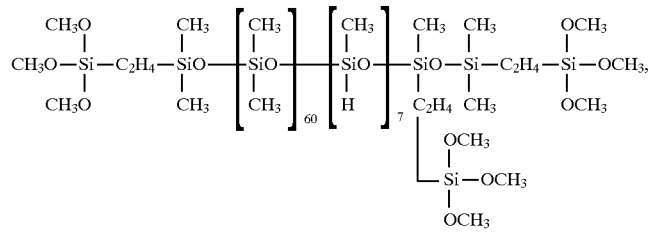

600 weight parts flake silver micropowder with an average particle size of 5 micrometers, 0.5 weight part methyltrimethoxysilane, 0.5 weight part diisopropoxybis (ethyl acetoacetate)titanium, 7 weight parts hydrophobic fumed silica with a specific surface area of 200 m²/g (made hydrophobic by surface treatment with hexamethyldisilazane), a 1,1,3,3-tetramethyl-1,3-divinyldisiloxane complex of platinum in sufficient quantity to provide 25 weight-ppm platinum metal in the present composition, and 3-phenyl-1-butyn-3-ol at 300 weight-ppm in the present composition. Semiconductor devices were then fabricated using this conductive silicone rubber composition. The results of the various evaluations are reported in Table 2.

Example 10

A conductive silicone rubber composition was prepared by mixing the following to homogeneity: 92 weight parts vinyldimethoxysiloxy-endblocked dimethylpolysiloxane (viscosity of 5,000 mPa.s) with the formula

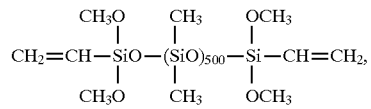

8 weight parts dimethylsiloxane-methylvinylsiloxane copolymer (viscosity of 50 mPa.s) with the formula

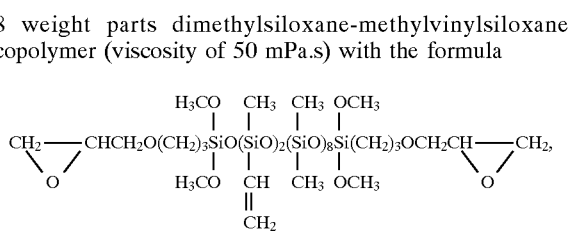

3.5 weight parts trimethylsiloxy-endblocked methylhydrogenpolysiloxane (viscosity of 20 mPa.s) with the formula

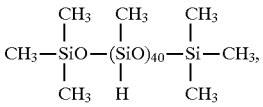

500 weight parts flake silver micropowder with an average particle size of 5 micrometers, 0.5 weight part vinyltrimethoxysilane, 0.5 weight part diisopropoxybis (ethyl acetoacetate)titanium, 7 weight parts hydrophobic fumed silica with a specific surface area of 200 m²/g (made hydrophobic by surface treatment with hexamethyldisilazane), a 1,1,3,3-tetramethyl-1,3-divinyldisiloxane complex of platinum in sufficient quantity to provide 25 weight-ppm platinum metal in the present composition, and 3-phenyl-1-butyn-3-ol at 300 weight-ppm in the present composition. Semiconductor devices were then fabricated using this conductive silicone rubber composition. The results of the various evaluations are reported in Table 2.

Comparative Example 2

A conductive silicone rubber composition was prepared by mixing the following to homogeneity: 100 weight parts dimethylvinylsiloxy-endblocked dimethylpolysiloxane (viscosity of 2,000 mPa.s) with the formula

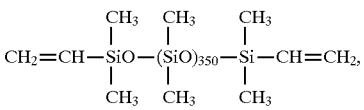

3 weight parts trimethylsiloxy-endblocked methylhydrogenpolysiloxane (viscosity of 20 mPa.s) with the formula

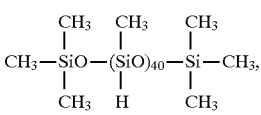

520 weight parts flake silver micropowder with an average particle size of 5 micrometers, 8 weight parts dimethylsiloxane-methylvinylsiloxane copolymer (viscosity of 50 mPa.s) with the formula

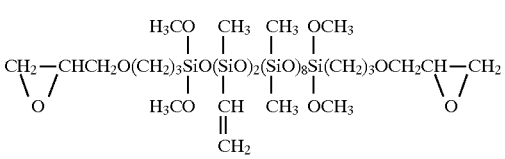

0.5 weight part vinyltrimethoxysilane, 7 weight parts hydrophobic fumed silica with a specific surface area of 200 m²/g (made hydrophobic by surface treatment with hexamethyldisilazane), a 1,1,3,3-tetramethyl-1,3-divinyldisiloxane complex of platinum in sufficient quantity to provide 25 weight-ppm platinum metal in the present composition, and 3-phenyl-1-butyn-3-ol at 300 weight-ppm in the present composition. Semiconductor devices were then fabricated using this conductive silicone rubber composition. The results of the various evaluations are reported in Table 2.

A characteristic feature of the silicone die attach adhesive according to the present invention is that it does not induce a deterioration in the wire bondability to the semiconductor chip or lead frame after the semiconductor chip has been bonded to its substrate. This characteristic feature accrues because the silicone die attach adhesive comprises a curable organopolysiloxane composition that cures through both addition and condensation reactions. The use of this silicone die attach adhesive endows the semiconductor device according to the present invention with a characteristically high reliability.

TABLE 1

|  | Invention Examples |  |  |  |  | Comp. Example |
|---|---|---|---|---|---|---|
|  | Ex. 1 | Ex. 2 | Ex. 3 | Ex. 4 | Ex. 5 | Comp. Ex. 1 |
| properties of the silicone die attach adhesive |  |  |  |  |  |  |
| use time (hours) | >5 | >5 | >5 | >5 | >5 | >5 |
| SOT (minutes) | 4 | 4 | 4 | 6 | 5 | >300 |
| properties of the cured product |  |  |  |  |  |  |
| state | rubber | rubber | rubber | rubber | rubber | rubber |
| durometer (JIS A) | 38 | 57 | 45 | 18 | 30 | 40 |
| proportion of defective bonding wire connections | 0/2880 | 0/2880 | 0/2880 | 0/2880 | 0/2880 | 137/2880 |
| proportion of semiconductor devices with a deficient moisture resistance |  |  |  |  |  |  |
| after 48 hours | 0/20 | 0/20 | 0/20 | 0/20 | 0/20 | 2/20 |
| after 168 hours | 0/20 | 0/20 | 0/20 | 0/20 | 0/20 | 8/18 |
| after 504 hours | 0/20 | 0/20 | 0/20 | 0/20 | 0/20 | 10/10 |
| proportion of semiconductor devices with delamination | 0/20 | 0/20 | 0/20 | 0/20 | 0/20 | 15/20 |

TABLE 2

|  | Invention Examples |  |  |  |  | Comparative Example |
|---|---|---|---|---|---|---|
|  | Ex. 6 | Ex. 7 | Ex. 8 | Ex. 9 | Ex. 10 | Comp. Ex. 2 |
| properties of the conductive silicone rubber composition |  |  |  |  |  |  |
| use time (hours) | >5 | >5 | >5 | >5 | >5 | >5 |
| SOT (minutes) | 5 | 5 | 6 | 8 | 8 | >300 |
| properties of the silicone rubber |  |  |  |  |  |  |
| durometer (JIS A) | 83 | 85 | 83 | 53 | 57 | 85 |
| volume resistivity (ohm-cm) | $5 \times 10^{-4}$ | $5 \times 10^{-4}$ | $5 \times 10^{-4}$ | $5 \times 10^{-4}$ | $5 \times 10^{-4}$ | $5 \times 10^{-4}$ |
| proportion of wire bonding defects | 0/2880 | 0/2880 | 0/2880 | 0/2880 | 0/2880 | 128/2880 |
| proportion with a deficient moisture resistance |  |  |  |  |  |  |
| after 48 hours | 0/20 | 0/20 | 0/20 | 0/20 | 0/20 | 2/20 |
| after 168 hours | 0/20 | 0/20 | 0/20 | 0/20 | 0/20 | 7/18 |
| after 504 hours | 0/20 | 0/20 | 0/20 | 0/20 | 0/20 | 11/11 |

TABLE 2-continued

|  | Invention Examples | | | | | Comparative Example |
|---|---|---|---|---|---|---|
|  | Ex. 6 | Ex. 7 | Ex. 8 | Ex. 9 | Ex. 10 | Comp. Ex. 2 |
| proportion with delamination from sealant resin | 0/20 | 0/20 | 0/20 | 0/20 | 0/20 | 13/20 |

Characteristic features of the conductive silicone rubber composition according to the present invention are that its cure yields a highly conductive silicone rubber and is not accompanied by contamination of the area around the composition with low-molecular-weight silicone oil. In the specific application of bonding semiconductor chips to substrates or packages, the composition characteristically does not impair wire bondability to the semiconductor chip or lead frame. The semiconductor device according to the present invention is characterized by high reliability by virtue of the use of the present conductive silicone rubber composition to bond the therein.

That which is claimed is:

1. A curable organopolysiloxane composition consisting essentially of:
   (A) 100 weight parts of a mixture of
      (a) 5 to 95 weight % of an alkoxy-substituted organopolysiloxane having a viscosity at 25° C. of 20 to 200,000 mPa.s and containing an average of at least two silicon-bonded alkoxy groups per molecule, and wherein the alkoxy-substituted organopolysiloxane is free of silicon-bonded alkenyl groups; and
      (b) 95 to 5 weight % of an alkenyl-substituted organopolysiloxane having a viscosity at 25° C. of 20 to 200,000 mPa.s and containing an average of at least two silicon-bonded alkenyl groups per molecule, and wherein the alkenyl-substituted organopolysiloxane is free of silicon-bonded alkoxy groups; and
   (B) a polyorganosiloxane having a viscosity at 25° C. of 2 to 20,000 mPa.s and containing an average of at least two silicon-bonded hydrogen atoms per molecule, in a quantity that affords a value of 0.5 to 20 for the molar ratio of silicon-bonded hydrogen atoms in component (B) to silicon-bonded alkenyl groups in component (b);
   (C) 0.01 to 10 parts by weight of a condensation reaction catalyst selected from the group consisting of organotitanium, organozirconium, and organoaluminum condensation reaction catalysts; and
   (D) platinum catalyst in a catalytic quantity.

2. The curable organosiloxane composition of claim 1 further comprising
   (E) 50 to 2000 weight parts of an electrically conductive filler.

3. The curable organosiloxane composition of claim 2 wherein component (E) is present in an amount ranging from 300 to 1000 parts by weight per 100 parts by weight of component (A).

4. The curable organosiloxane composition of claim 2 wherein component (E) is selected from the group consisting of gold micropowder and silver micropowder.

5. The curable organosiloxane composition of claim 4 wherein component (E) is silver micropowder.

6. The curable organosiloxane composition of claim 1 wherein the silicon-bonded alkoxy groups of component (a) are individually selected from the group consisting of methoxy, ethoxy, propoxy, butoxy, methoxymethoxy and methoxyethoxy.

7. The curable organosiloxane composition of claim 6 wherein the silicon-bonded alkoxy groups of component (a) are methoxy.

8. The curable organosiloxane composition of claim 1 wherein the viscosity of at 25° C. of component (a) is from 100 to 100,000 mPa.s.

9. The curable organosiloxane composition of claim 1 wherein the silicon-bonded alkenyl groups of component (b) are individually selected from the group consisting of vinyl, allyl, butenyl, pentenyl and hexenyl.

10. The curable organosiloxane composition of claim 9 wherein the silicon-bonded alkenyl groups of component (b) are vinyl.

11. The curable organosiloxane composition of claim 1 wherein the viscosity of at 25° C. of component (b) is from 100 to 100,000 mPa.s.

12. The curable organosiloxane composition of claim 1 wherein component (C) is present in an amount ranging from 0.1 to 5 weight parts per 100 weight parts component (A).

13. A product prepared by admixing materials consisting essentially of:
   (A) 100 weight parts of a mixture of
      (a) 5 to 95 weight % of an alkoxy-substituted organopolysiloxane having a viscosity at 25° C. of 20 to 200,000 mPa.s and containing an average of at least two silicon-bonded alkoxy groups per molecule, and wherein the alkoxy-substituted organopolysiloxane is free of silicon-bonded alkenyl groups; and
      (b) 95 to 5 weight % of an alkenyl-substituted organopolysiloxane having a viscosity at 25° C. of 20 to 200,000 mPa.s and containing an average of at least two silicon-bonded alkenyl groups per molecule, and wherein the alkenyl-substituted organopolysiloxane is free of silicon-bonded alkoxy groups; and
   (B) a polyorganosiloxane having a viscosity at 25° C. of 2 to 20,000 mPa.s and containing an average of at least two silicon-bonded hydrogen atoms per molecule, in a quantity that affords a value of 0.5 to 20 for the molar ratio of silicon-bonded hydrogen atoms in component (B) to silicon-bonded alkenyl groups in component (b);
   (C) 0.01 to 10 parts by weight of a condensation reaction catalyst selected from the group consisting of organotitanium, organozirconium, and organoaluminum condensation reaction catalysts; and
   (D) platinum catalyst in a catalytic quantity.

14. A product prepared by admixing materials consisting essentially of:
   (A) 100 weight parts of a mixture of
      (a) 5 to 95 weight % of an alkoxy-substituted organopolysiloxane having a viscosity at 25° C. of 20 to 200,000 mPa.s and containing an average of at least two silicon-bonded alkoxy groups per molecule, and wherein the alkoxy-substituted organopolysiloxane is free of silicon-bonded alkenyl groups; and (b) 95 to 5 weight % of an alkenyl-substituted organopolysiloxane having a viscosity at 25° C. of 20 to 200,000 mPa.s and containing an average of at least two silicon-bonded alkenyl groups per molecule, and wherein the alkenyl-substituted organopolysiloxane is free of silicon-bonded alkoxy groups; and (B) a polyorganosiloxane having a viscosity at 25° C. of 2 to 20,000 mPa.s and containing an average of at least two silicon-bonded hydrogen atoms per molecule, in a quantity that affords a value of 0.5 to 20 for the molar ratio of silicon-bonded hydrogen atoms in component (B) to silicon-bonded alkenyl groups in component (b);

(C) 0.01 to 10 parts by weight of a condensation reaction catalyst selected from the group consisting of organotitanium, organozirconium, and organoaluminum condensation reaction catalysts;

(D) platinum catalyst in a catalytic quantity; and (E) 50 to 2000 parts by weight of an electrically conductive filler.

15. A curable organosiloxane composition, which is curable via both addition and condensation reactions, said curable organopolysiloxane composition consisting essentially of:

(A') 100 parts by weight of an alkenyl-substituted organopolysiloxane having a viscosity at 25° C. of 20 to 200,000 mPa.s and containing an average of at least two silicon-bonded alkenyl groups per molecule;

(B') a polyorganosiloxane having a viscosity at 25° C. of 2 to 20,000 mPa.s, and containing an average of at least two silicon-bonded hydrogen atoms per molecule in a quantity that affords a value from 0.5 to 20 for the molar ratio of silicon-bonded hydrogen atoms in component (B') to silicon-bonded alkenyl groups in component (A');

(C) 0.01 to 10 parts by weight of a condensation reaction catalyst selected from the group consisting of organotitanium, organozirconium, and organoaluminum condensation reaction catalysts; and (D) platinum catalyst in a catalytic quantity;

with the proviso that at least one of components (A') and (B') contains an average of at least two silicon-bonded alkoxy groups per molecule.

16. The curable organosiloxane composition of claim 15 wherein the silicon-bonded alkenyl groups of component (A') are individually selected from the group consisting of vinyl, allyl, butenyl, pentenyl, hexenyl, and heptenyl.

17. The curable organosiloxane composition of claim 16 wherein the silicon-bonded alkenyl groups of component (A') are vinyl.

18. The curable organosiloxane composition of claim 15 wherein the viscosity of at 25° C. of component (A') is from 100 to 100,000 mPa.s.

19. The curable organosiloxane composition of claim 15 wherein component (C) is present in an amount ranging from 0.1 to 5 weight parts per 100 weight parts component (A').

20. The curable organosiloxane composition of claim 15 further comprising (E) 50 to 2000 weight parts of an electrically conductive filler.

21. The curable organosiloxane composition of claim 20 wherein component (E) is present in an amount ranging from 300 to 1000 parts by weight per 100 parts by weight of component (A).

22. The curable organosiloxane composition of claim 20 wherein component (E) is selected from the group consisting of gold micropowder and silver micropowder.

23. The curable organosiloxane composition of claim 22 wherein component (E) is silver micropowder.

24. A product prepared by admixing materials consisting essentially of:

(A') 100 parts by weight of an alkenyl-substituted organopolysiloxane having a viscosity at 25° C. of 20 to 200,000 mPa.s and containing an average of at least two silicon-bonded alkenyl groups per molecule;

(B') a polyorganosiloxane having a viscosity at 25° C. of 2 to 20,000 mPa.s, and containing an average of at least two silicon-bonded hydrogen atoms per molecule in a quantity that affords a value from 0.5 to 20 for the molar ratio of silicon-bonded hydrogen atoms in component (B') to silicon-bonded alkenyl groups in component (A');

(C) 0.01 to 10 parts by weight of a condensation reaction catalyst selected from the group consisting of organotitanium, organozirconium and organoaluminum condensation reaction catalysts; and (D) platinum catalyst in a catalytic quantity;

with the proviso that at least one of components (A') and (B') contains an average of at least two silicon-bonded alkoxy groups per molecule.

25. A product prepared by admixing materials consisting essentially of:

(A') 100 parts by weight of an alkenyl-substituted organopolysiloxane having a viscosity at 25° C. of 20 to 200,000 mPa.s and containing an average of at least two silicon-bonded alkenyl groups per molecule;

(B') a polyorganosiloxane having a viscosity at 25° C. of 2 to 20,000 mPa.s, and containing an average of at least two silicon-bonded hydrogen atoms per molecule in a quantity that affords a value from 0.5 to 20 for the molar ratio of silicon-bonded hydrogen atoms in component (B') to silicon-bonded alkenyl groups in component (A');

(C) 0.01 to 10 parts by weight of a condensation reaction catalyst selected from the group consisting of organotitanium, organozirconium, and organoaluminum condensation reaction catalysts;

(D) platinum catalyst in a catalytic quantity; and (E) 50 to 2000 parts by weight of an electrically conductive filler;

with the proviso that at least one of components (A') and (B') contains an average of at least two silicon-bonded alkoxy groups per molecule.

26. A semiconductor device comprising (A) a semiconductor chip;

(B) a substrate; and (C) a silicone die attach adhesive prepared by curing a curable organosiloxane composition which is curable via both addition and condensation reactions;

wherein the semiconductor chip is bonded to the substrate with the silicone die attach adhesive.

27. The semiconductor device of claim 26 wherein the curable organosiloxane composition consists essentially of:

(A) 100 weight parts of a mixture of (a) 5 to 95 weight % of an alkoxy-substituted organopolysiloxane having a viscosity at 25° C. of 20 to 200,000 mPa.s and containing an average of at least two silicon-bonded alkoxy groups per molecule, and wherein the alkoxy-substituted organopolysiloxane is free of silicon-bonded alkenyl groups; and (b) 95 to 5 weight % of an alkenyl-substituted organopolysiloxane having a viscosity at 25° C. of 20 to 200,000 mPa.s and containing an average of at least two silicon-bonded alkenyl groups per molecule, and wherein the alkenyl-substituted organopolysiloxane is free of silicon-bonded alkoxy groups; and (B) a polyorganosiloxane having a viscosity at 25° C. of 2 to 20,000 mPa.s and containing an average of at least two silicon-bondedhydrogen atoms per molecule, in a quantity that affords a value of 0.5 to 20 for the molar ratio of silicon-bonded hydrogen atoms in component (B) to silicon-bonded alkenyl groups in component (b);

(C) 0.01 to 10 parts by weight of a condensation reaction catalyst selected from the group consisting of organotitanium, organozirconium, and organoaluminum condensation reaction catalysts; and (D) platinum catalyst in a catalytic quantity.

28. The semiconductor device of claim 26 wherein the curable organosiloxane composition consists essentially of:

(A) 100 weight parts of a mixture of
  (a) 5 to 95 weight % of an alkoxy-substituted organopolysiloxane having a viscosity at 25° C. of 20 to 200,000 mPa.s and containing an average of at least two silicon-bonded alkoxy groups per molecule, and wherein the alkoxy-substituted organopolysiloxane is free of silicon-bonded alkenyl groups; and
  (b) 95 to 5 weight % of an alkenyl-substituted organopolysiloxane having a viscosity at 25° C. of 20 to 200,000 mPa.s and containing an average of at least two silicon-bonded alkenyl groups per molecule, and wherein the alkenyl-substituted organopolysiloxane is free of silicon-bonded alkoxy groups; and (B) a polyorganosiloxane having a viscosity at 25° C. of 2 to 20,000 mPa.s and containing an average of at least two silicon-bonded hydrogen atoms per molecule, in a quantity that affords a value of 0.5 to 20 for the molar ratio of silicon-bonded hydrogen atoms in component (B) to silicon-bonded alkenyl groups in component (b);

(C) 0.01 to 10 parts by weight of a condensation reaction catalyst selected from the group consisting of organotitanium, organozirconium, and organoaluminum condensation reaction catalysts;

(D) platinum catalyst in a catalytic quantity; and (E) 50 to 2000 weight parts of an electrically conductive filler.

29. The semiconductor device of claim 26 wherein the curable organosiloxane composition consists essentially of:

(A') 100 parts by weight of an alkenyl-substituted organopolysiloxane having a viscosity at 25° C. of 20 to 200,000 mPa.s and containing an average of at least two silicon-bonded alkenyl groups per molecule;

(B') a polyorganosiloxane having a viscosity at 25° C. of 2 to 20,000 mPa.s, and containing an average of at least two silicon-bonded hydrogen atoms per molecule in a quantity that affords a value from 0.5 to 20 for the molar ratio of silicon-bonded hydrogen atoms in component (B') to silicon-bonded alkenyl groups in component (A');

(C) 0.01 to 10 parts by weight of a condensation reaction catalyst selected from the group consisting of organotitanium, organozirconium, and organoaluminum condensation reaction catalysts; and (D) platinum catalyst in a catalytic quantity;

with the proviso that at least one of components (A') and (B') contains an average of at least two silicon-bonded alkoxy groups per molecule.

30. The semiconductor device of claim 26 wherein the curable organosiloxane composition consists essentially of:

(A') 100 parts by weight of an alkenyl-substituted organopolysiloxane having a viscosity at 25° C. of 20 to 200,000 mPa.s and containing an average of at least two silicon-bonded alkenyl groups per molecule;

(B') a polyorganosiloxane having a viscosity at 25° C. of 2 to 20,000 mPa.s, and containing an average of at least two silicon-bonded hydrogen atoms per molecule in a quantity that affords a value from 0.5 to 20 for the molar ratio of silicon-bonded hydrogen atoms in component (B') to silicon-bonded alkenyl groups in component (A');

(C) 0.01 to 10 parts by weight of a condensation reaction catalyst selected from the group consisting of organotitanium, organozirconium, and organoaluminum condensation reaction catalysts;

(D) platinum catalyst in a catalytic quantity; and (E) 50 to 2000 weight parts of an electrically conductive filler;

with the proviso that at least one of components (A') and (B') contains an average of at least two silicon-bonded alkoxy groups per molecule.

31. A method for making a semiconductor device, said method comprising the steps of:

(A) providing a semiconductor chip;

(B) providing a substrate;

(C) applying a curable organopolysiloxane composition, which is curable via both addition and condensation reactions, to at least one of said semiconductor chip and said substrate; and (D) curing said curable organopolysiloxane composition.

32. The method of claim 31 wherein the curable organosiloxane composition consists essentially of:

(A) 100 weight parts of a mixture of
  (a) 5 to 95 weight % of an alkoxy-substituted organopolysiloxane having a viscosity at 25° C. of 20 to 200,000 mPa.s and containing an average of at least two silicon-bonded alkoxy groups per molecule, and wherein the alkoxy-substituted organopolysiloxane is free of silicon-bonded alkenyl group; and
  (b) 95 to 5 weight % of an alkenyl-substituted organopolysiloxane having a viscosity at 25° C. of 20 to 200,000 mPa.s and containing an average of at least two silicon-bonded alkenyl groups per molecule, and wherein the alkenyl-substituted organopolysiloxane is free of silicon-bonded alkoxy groups; and (B) a polyorganosiloxane having a viscosity at 25° C. of 2 to 20,000 mPa.s and containing an average of at least two silicon-bonded hydrogen atoms per molecule, in a quantity that affords a value of 0.5 to 20 for the molar ratio of silicon-bonded hydrogen atoms in component (B) to silicon-bonded alkenyl groups in component (b);

(C) 0.01 to 10 parts by weight of a condensation reaction catalyst selected from the group consisting of organotitanium, organozirconium, and organoaluminum condensation reaction catalysts; and (D) platinum catalyst in a catalytic quantity.

33. The method of claim 31 wherein the curable organosiloxane composition consists essentially of:

(A) 100 weight parts of a mixture of
  (a) 5 to 95 weight % of an alkoxy-substituted organopolysiloxane having a viscosity at 25° C. of 20 to 200,000 mPa.s and containing an average of at least two silicon-bonded alkoxy groups per molecule, and wherein the alkoxy-substituted organopolysiloxane is free of silicon-bonded alkenyl groups; and (b) 95 to 5 weight % of an alkenyl-substituted organopolysiloxane having a viscosity at 25° C. of 20 to 200,000 mPa.s and containing an average of at least two silicon-bonded alkenyl groups per molecule, and wherein the alkenyl-substituted organopolysiloxane is free of silicon-bonded alkoxy groups; and (B) a polyorganosiloxane having a viscosity at 25° C. of 2 to 20,000 mPa.s and containing an average of at least two silicon-bonded hydrogen atoms per molecule, in a quantity that affords a value of 0.5 to 20 for the molar ratio of silicon-bonded hydrogen atoms in component (B) to silicon-bonded alkenyl groups in component (b);

(C) 0.01 to 10 parts by weight of a condensation reaction catalyst selected from the group consisting of organotitanium, organozirconium, and organoaluminum condensation reaction catalysts;

(D) platinum catalyst in a catalytic quantity; and (E) 50 to 2000 weight parts of an electrically conductive filler.

34. The method of claim 31 wherein the curable organosiloxane composition consists essentially of:

(A') 100 parts by weight of an alkenyl-substituted organopolysiloxane having a viscosity at 25° C. of 20 to 200,000 mPa.s and containing an average of at least two silicon-bonded alkenyl groups per molecule;

(B') a polyorganosiloxane having a viscosity at 25° C. of 2 to 20,000 mPa.s, and containing an average of at least two silicon-bonded hydrogen atoms per molecule in a quantity that affords a value from 0.5 to 20 for the molar ratio of silicon-bonded hydrogen atoms in component (B') to silicon-bonded alkenyl groups in component (A');

(C) 0.01 to 10 parts by weight of a condensation reaction catalyst selected from the group consisting of organotitanium, organozirconium, and organoaluminum condensation reaction catalysts; and (D) platinum catalyst in a catalytic quantity;

with the proviso that at least one of components (A') and (B') contains an average of at least two silicon-bonded alkoxy groups per molecule.

35. The method of claim 31 wherein the curable organosiloxane composition consists essentially of:

(A') 100 parts by weight of an alkenyl-substituted organopolysiloxane having a viscosity at 25° C. of 20 to 200,000 mPa.s and containing an average of at least two silicon-bonded alkenyl groups per molecule;

(B') a polyorganosiloxane having a viscosity at 25° C. of 2 to 20,000 mPa.s, and containing an average of at least two silicon-bonded hydrogen atoms per molecule in a quantity that affords a value from 0.5 to 20 for the molar ratio of silicon-bonded hydrogen atoms in component (B') to silicon-bonded alkenyl groups in component (A');

(C) 0.01 to 10 parts by weight of a condensation reaction catalyst selected from the group consisting of organotitanium, organozirconium, and organoaluminum condensation reaction catalysts;

(D) platinum catalyst in a catalytic quantity; and (E) 50 to 2000 weight parts of an electrically conductive filler;

with the proviso that at least one of components (A') and (B') contains an average of at least two silicon-bonded alkoxy groups per molecule.

* * * * *